(12) United States Patent
Terada

(10) Patent No.: US 10,664,343 B2
(45) Date of Patent: May 26, 2020

(54) MEMORY CONTROLLER, NON-VOLATILE MEMORY, AND METHOD OF CONTROLLING MEMORY CONTROLLER

(71) Applicant: SONY CORPORATION, Tokyo (JP)

(72) Inventor: Haruhiko Terada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/072,831

(22) PCT Filed: Dec. 1, 2016

(86) PCT No.: PCT/JP2016/085740
§ 371 (c)(1),
(2) Date: Jul. 25, 2018

(87) PCT Pub. No.: WO2017/138235
PCT Pub. Date: Aug. 17, 2017

(65) Prior Publication Data
US 2019/0034266 A1    Jan. 31, 2019

(30) Foreign Application Priority Data
Feb. 8, 2016  (JP) ................................. 2016-021813

(51) Int. Cl.
*G06F 11/10* (2006.01)
*G06F 12/16* (2006.01)
(Continued)

(52) U.S. Cl.
CPC .......... *G06F 11/10* (2013.01); *G06F 11/1048* (2013.01); *G06F 12/16* (2013.01);
(Continued)

(58) Field of Classification Search
CPC ........ G06F 11/10; G06F 12/16; G11C 11/005; G11C 13/0026; G11C 13/0028
See application file for complete search history.

(56) References Cited

U.S. PATENT DOCUMENTS

2003/0097482 A1* 5/2003 DeHart .................. H04L 29/06
709/253
2005/0157526 A1* 7/2005 Hanzawa ............... G11C 15/04
365/49.12

(Continued)

FOREIGN PATENT DOCUMENTS

| JP | 2007-109008 A | 4/2007 |
| JP | 2007-299436 A | 11/2007 |
| JP | 2015-142381 A | 8/2015 |

OTHER PUBLICATIONS

International Search Report and Written Opinion of PCT Application No. PCT/JP2016/085740, dated Jan. 10, 2017, 6 pages of ISRWO.

*Primary Examiner* — Kyle Vallecillo
(74) *Attorney, Agent, or Firm* — Chip Law Group

(57) ABSTRACT

To suppress an increase in a voltage drop in a non-volatile memory including a variable resistive element installed therein. A memory controller includes a voltage drop amount estimating unit and an encoding unit. The voltage drop amount estimating unit estimates a voltage drop amount from a wiring resistance of a wiring up to a memory cell and a leakage current occurring in the memory cell when original data is caused to be held in the memory cell. The encoding unit performs a predetermined encoding process on the original data in a case in which the estimated voltage drop amount exceeds a predetermined threshold value.

17 Claims, 35 Drawing Sheets

(51) Int. Cl.
  *G11C 13/00* (2006.01)
  *G11C 11/00* (2006.01)
  *G11C 11/56* (2006.01)
  *G11C 8/08* (2006.01)
  *G11C 7/10* (2006.01)
  *G11C 7/12* (2006.01)

(52) U.S. Cl.
  CPC .............. *G11C 7/1006* (2013.01); *G11C 7/12* (2013.01); *G11C 8/08* (2013.01); *G11C 11/005* (2013.01); *G11C 11/5678* (2013.01); *G11C 13/0026* (2013.01); *G11C 13/0028* (2013.01); *G11C 13/0033* (2013.01); *G11C 2213/72* (2013.01)

(56) References Cited

U.S. PATENT DOCUMENTS

| | | | |
|---|---|---|---|
| 2006/0044872 A1* | 3/2006 | Nazarian | G11C 16/0483 365/185.17 |
| 2006/0239102 A1* | 10/2006 | Saita | H01L 23/5286 365/226 |
| 2007/0091707 A1 | 4/2007 | Hidaka | |
| 2007/0195590 A1* | 8/2007 | Sugita | G11C 13/0007 365/163 |
| 2009/0067244 A1* | 3/2009 | Li | G11C 7/1006 365/185.12 |
| 2009/0097295 A1* | 4/2009 | Morimoto | G11C 13/0004 365/51 |
| 2010/0172171 A1* | 7/2010 | Azuma | G11C 13/003 365/148 |
| 2010/0172172 A1* | 7/2010 | Kim | G11C 8/08 365/148 |
| 2015/0212877 A1 | 7/2015 | Kern et al. | |

* cited by examiner

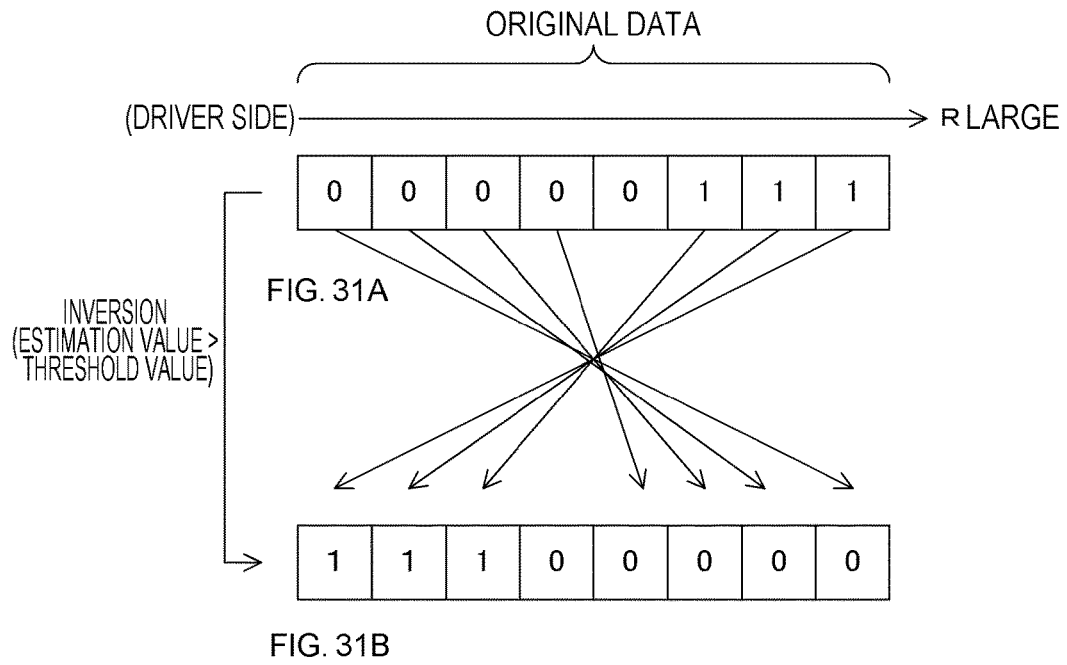
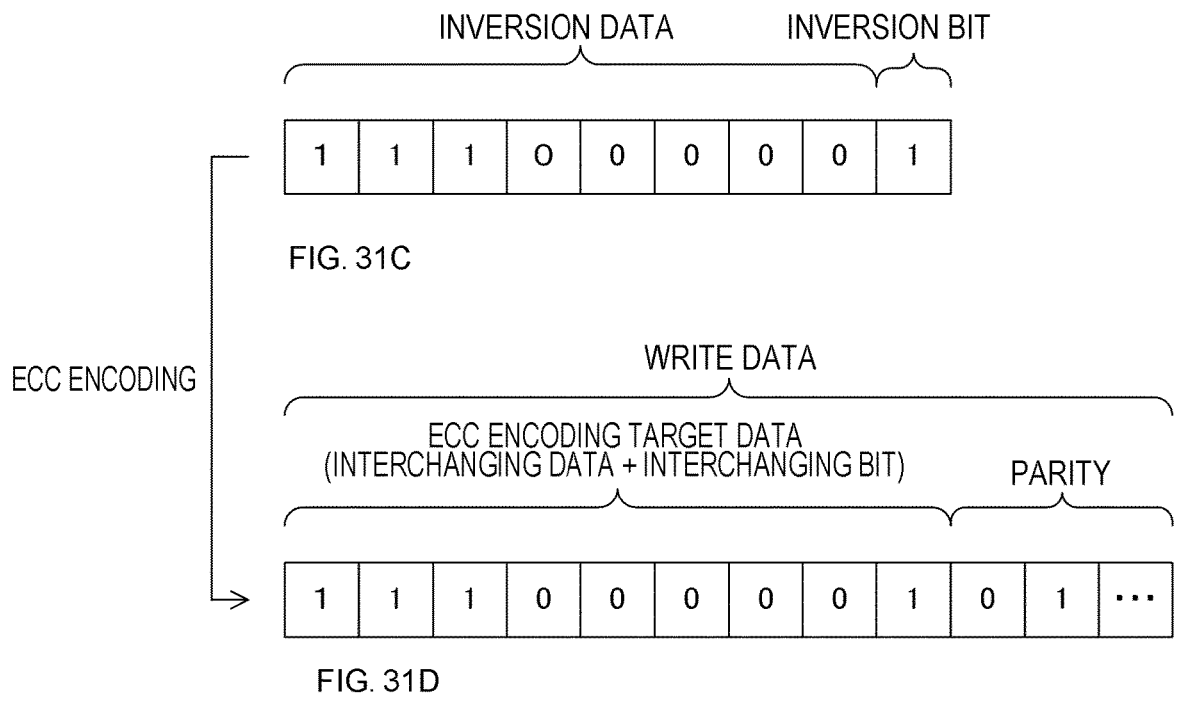

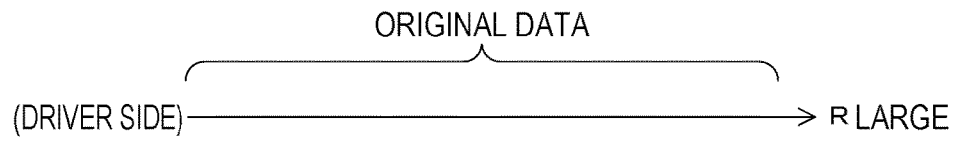

MEMORY CONTROLLER, NON-VOLATILE MEMORY, AND METHOD OF CONTROLLING MEMORY CONTROLLER

CROSS REFERENCE TO RELATED APPLICATIONS

This application is a U.S. National Phase of International Patent Application No. PCT/JP2016/085740 filed on Dec. 1, 2016, which claims priority benefit of Japanese Patent Application No. JP 2016-021813 filed in the Japan Patent Office on Feb. 8, 2016. Each of the above-referenced applications is hereby incorporated herein by reference in its entirety.

TECHNICAL FIELD

The present technology relates to a memory controller, a non-volatile memory, and a method of controlling a memory controller. Particularly, the present technology relates to a memory controller including a variable resistive element installed therein, a non-volatile memory, and a method of controlling a memory controller.

BACKGROUND ART

Non-volatile memories (NVMs) have been used as auxiliary storage devices or storages in recent information processing systems. Non-volatile memories are broadly divided into flash memories for data access in units of large data sizes and non-volatile random access memories (Non-volatile RAMs) to which high-speed random access is possible in units of smaller data sizes. Here, NAND flash memories are exemplified as a representative example of flash memories. On the other hand, resistive RAMs (ReRAMs), phase-change RAMs (PCRAMs), magnetoresistive RAMs (MRAMs), and the like are exemplified as examples of non-volatile random access flash memories. Among these memories, ReRAMs have attracted attention due to high access speed and the like.

Generally, in ReRAMs, a memory cell including a variable resistive element is disposed at each of intersection points of column lines and row lines which are wired in a two-dimensional lattice pattern. A driver selects a memory cell of a rewrite target on the basis of write data and applies a voltage between the column line and the row line to cause a resistance value of the selected memory cell to be changed. At this time, in ReRAM, the leakage current increases as the resistance value of the memory cell decreases. In this regard, a memory controller that encodes (inversion or the like) data so that the number of memory cells with a large resistance value does not exceed a threshold value in a case in which the number of memory cells with a large resistance value exceeds a threshold value in order to reduce power consumption has been proposed (see, for example, Patent Literature 1).

CITATION LIST

Patent Literature

Patent Literature 1: JP 2007-299436A

DISCLOSURE OF INVENTION

Technical Problem

In a case in which the related art described above is applied, for example, when "0" is allocated to a low resistance state, "1" is allocated to a high resistance state, and data of the binary number "11111000" is written, the memory controller counts the number of "1s" (low resistance states) and compares a count value with a threshold value "4." Since the count value is larger than "4," the memory controller inverts data and writes "00000111." Here, a wiring resistance up to a memory cell corresponding to an n-th bit (n is an integer from 0 to 7) from a left end of the data is indicated by $(n+1) \times R_0$. Further, a leakage current of a memory cell of "1" (the low resistance state) is indicated by be $I_{LEAK}$, and a leakage current of a memory cell of "0" (the high resistance state) is indicated by "0." In this case, an IR drop before inversion is $15 \times I_{LEAK} R_0$, while an IR drop after inversion is $21 \times I_{LEAK} R_0$.

As described above, in the related art described above, the number of memory cells of "0" with a small leakage current increases due to the inversion, and thus the power consumption decreases, while the IR drop instead increases. Due to the increase in the IR drop, an operation at a low voltage becomes unstable. This is because, in a case in which a power voltage is given a certain degree of margin so that a value after the drop does not fall below a certain minimum operating voltage even when the power voltage drops due to the IR drop, the margin is decreased due to the increase in the IR drop.

The present technology was made in light of the foregoing, and an object thereof is to suppress an increase in a voltage drop in a non-volatile memory including a variable resistive element installed therein.

Solution to Problem

The present technology has been made to solve the above problem. According to a first aspect of the present technology, there is provided a memory controller or a method of controlling the memory controller. The memory controller includes: a voltage drop amount estimating unit configured to estimate a voltage drop amount from a wiring resistance of a wiring up to a memory cell and a leakage current occurring in the memory cell when original data is caused to be held in the memory cell; and an encoding unit configured to perform a predetermined encoding process on the original data in a case in which the estimated voltage drop amount exceeds a predetermined threshold value. Accordingly, an effect that, in a case in which the estimation value of the voltage drop amount exceeds the threshold value, a predetermined encoding process is performed is obtained.

In addition, according to the first aspect, the original data may include a plurality of pieces of section data, and the voltage drop amount estimating unit may estimate the voltage drop amount on a basis of a weight coefficient corresponding to a representative value of the wiring resistance in each of the plurality of pieces of section data and a value corresponding to a leakage current in each of the plurality of pieces of section data. Accordingly, an effect that the voltage drop amount is estimated on the basis of the weight coefficient corresponding to the representative value of the wiring resistance in each of the plurality of pieces of section data and the value corresponding to the leakage current is obtained.

In addition, according to the first aspect, the memory controller may further include: a memory cell array including memory cells arranged in a two-dimensional lattice pattern; a row driver configured to drive a row including the memory cells arranged in a predetermined direction; and a column driver configured to drive a column including the memory cells arranged in a direction perpendicular to the predetermined direction. The voltage drop amount estimating unit may estimate the voltage drop amount from the leakage current and the wiring resistance of the wiring from the row driver or the column driver to the memory cell. Accordingly, an effect that the voltage drop amount is estimated from the wiring resistance from the row driver or the column driver and the leakage current is obtained.

In addition, according to the first aspect, the memory controller may further include an address generating unit configured to generate any of an address indicating a position of a block including the memory cells arranged in a predetermined direction in the memory cell array and an address indicating a position of a block including the memory cells arranged in a direction perpendicular to the predetermined direction, as a write address. Accordingly, an effect that the data is written in a block including the memory cells arranged in one of a predetermined direction and the vertical direction is obtained.

In addition, according to the first aspect, the address generating unit may generate an address indicating a position of a plurality of blocks in which a sum of block sizes is constant, as the write address. Accordingly, an effect that the data is written in units of certain access units is obtained.

In addition, according to the first aspect, the memory cell array may be divided into an estimation-free region in which a wiring distance from the row driver and a wiring distance from the column driver do not exceed a predetermined distance and an estimation region in which the wiring distances exceed the predetermined distance, and the voltage drop amount estimating unit may estimate the voltage drop amount when the original data is caused to be held in the estimation region. Accordingly, an effect that the voltage drop amount is not estimated in the estimation-free region is obtained.

In addition, according to the first aspect, the row driver may include an odd-numbered row driver configured to drive odd-numbered rows, and an even-numbered row driver configured to drive even-numbered rows. The voltage drop amount estimating unit may estimate the voltage drop amount on a basis of a wiring resistance of the wiring from the odd-numbered row driver in a case in which the original data is caused to be held in the odd-numbered row in a predetermined estimation region, and estimate the voltage drop amount on a basis of a wiring resistance of the wiring from the even-numbered row driver in a case in which the original data is caused to be held in the even-numbered row in the predetermined estimation region. Accordingly, an effect that the odd-numbered rows and the even-numbered rows are driven by the odd-numbered row driver and the even-numbered row driver is obtained.

In addition, according to the first aspect, the column driver may include an odd-numbered column driver configured to drive odd-numbered columns, and an even-numbered column driver configured to drive even-numbered columns. The voltage drop amount estimating unit may estimate the voltage drop amount on a basis of a wiring resistance of the wiring from the odd-numbered column driver in a case in which the original data is caused to be held in the odd-numbered column in a predetermined estimation region, and estimate the voltage drop amount on a basis of a wiring resistance of the wiring from the even-numbered column driver in a case in which the original data is caused to be held in the even-numbered column in the predetermined estimation region. Accordingly, an effect that the odd-numbered columns and the even-numbered column are driven by the odd-numbered column driver and the even-numbered column driver is obtained.

In addition, according to the first aspect, the encoding unit may output non-management information and management information for decoding the non-management information in the predetermined encoding process. Accordingly, an effect that the management information is generated in encoding is obtained.

In addition, according to the first aspect, the predetermined encoding process may be an inversion process of inverting the original data, and the management information may include an inversion bit indicating whether or not the inversion process is performed. Accordingly, an effect that the inversion process is performed on the basis of the estimation value of the voltage drop amount is obtained.

In addition, according to the first aspect, the predetermined encoding process may be an interchanging process of interchanging an order of bits of the original data, and the management information may include an interchanging bit indicating whether or not the interchanging process is performed. Accordingly, an effect that the order of the bits is interchanged on the basis of the estimation value of the voltage drop amount is obtained.

In addition, according to the first aspect, the memory cell may be a multi-value memory cell configured to hold a plurality of bits, the encoding process may include a replacement process of replacing a specific value to be held in the multi-value memory cell in the original data with a value different from the specific value, and the management information may include a replacement bit indicating whether or not the replacement process is performed. Accordingly, an effect that the replacement process is performed on the basis of the estimation value of the voltage drop amount is obtained.

In addition, according to the first aspect, the encoding unit may perform an error detection and correction encoding process of generating parity used for detecting presence or absence of an error in the non-management information, and the predetermined encoding process. Accordingly, an effect that the error detection and correction encoding process is further executed is obtained.

In addition, according to the first aspect, the encoding unit may perform an error detection and correction encoding process of generating parity used for detecting presence or absence of an error of the original data and supplying the parity to the voltage drop amount estimating unit together with the original data, and the predetermined encoding process, and the voltage drop amount estimating unit may estimate a voltage drop amount from the wiring resistance and a leakage current occurring in the memory cell when the original data and the parity are caused to be held in the memory cell. Accordingly, an effect that a predetermined encoding process is performed after the error detection and correction encoding process is obtained.

In addition, according to a second aspect, there is provided a memory controller including: an address generating unit configured to generate any of an address indicating a position of a block including memory cells arranged in a predetermined direction in a memory cell array including a plurality of memory cells arranged in a two-dimensional lattice pattern and an address indicating a position of a block including memory cells arranged in a direction perpendicular to the predetermined direction, as a write address; and an encoding unit configured to encode original data and supply the encoded original data as write data to be held at the write address. Accordingly, an effect that the data is written in the predetermined number of memory cells arranged in one of a predetermined direction and the vertical direction is obtained.

In addition, according to a third aspect, there is provided a non-volatile memory including: a voltage drop amount estimating unit configured to estimate a voltage drop amount from a wiring resistance of a wiring up to a memory cell and a leakage current occurring in the memory cell when original data is caused to be held in the memory cell; an encoding unit configured to perform a predetermined encoding process on the original data and generate write data in a case in which the estimated voltage drop amount exceeds a predetermined threshold value; and a driver configured to drive the memory cell array on a basis of the write data. Accordingly, an effect that, in a case in which the estimation value of the voltage drop amount exceeds the threshold value, the memory cell array is driven on the basis of the write data which has undergone the predetermined encoding process is obtained.

Advantageous Effects of Invention

According to the present technology, an effect that it is possible to suppress an increase in a voltage drop in a non-volatile memory including a variable resistive element installed therein can be obtained. Note that effects described herein are not necessarily limitative, and any effect that is desired to be described in the present disclosure may be admitted.

BRIEF DESCRIPTION OF DRAWINGS

FIGS. 31A, 31B, 31C, and 31D are diagrams illustrating an example of data before and after encoding in the seventh embodiment of the present technology.

FIGS. 35A, 35B, 35C, and 35D are diagrams illustrating an example of data before and after encoding in the eighth embodiment of the present technology.

MODE(S) FOR CARRYING OUT THE INVENTION

Hereinafter, modes for carrying out the present technology (hereinafter referred to as "embodiments") will be described. The description will proceed in the following order.
1. First embodiment (example of estimating voltage drop amount and inverting original data)
2. Second embodiment (an example of estimating voltage drop amount on basis of weight coefficient of each piece of section data and inverting original data)
3. Third embodiment (example of estimating voltage drop amount in row direction or column direction and inverting original data)
4. Fourth embodiment (example of estimating voltage drop amount and inverting original data in configuration in which two row drivers are disposed)
5. Fifth embodiment (example of estimating voltage drop amount and inverting original data in configuration in which two column drivers are disposed)
6. Sixth embodiment (example of estimating voltage drop amount after ECC encoding and inverting original data)
7. Seventh embodiment (example of estimating voltage drop amount and interchanging order of bits of original data)
8. Eighth embodiment (example of estimating voltage drop amount and performing replacement process on original data)

1. First Embodiment

[Example of Configuration of Memory System]

Figure 1:
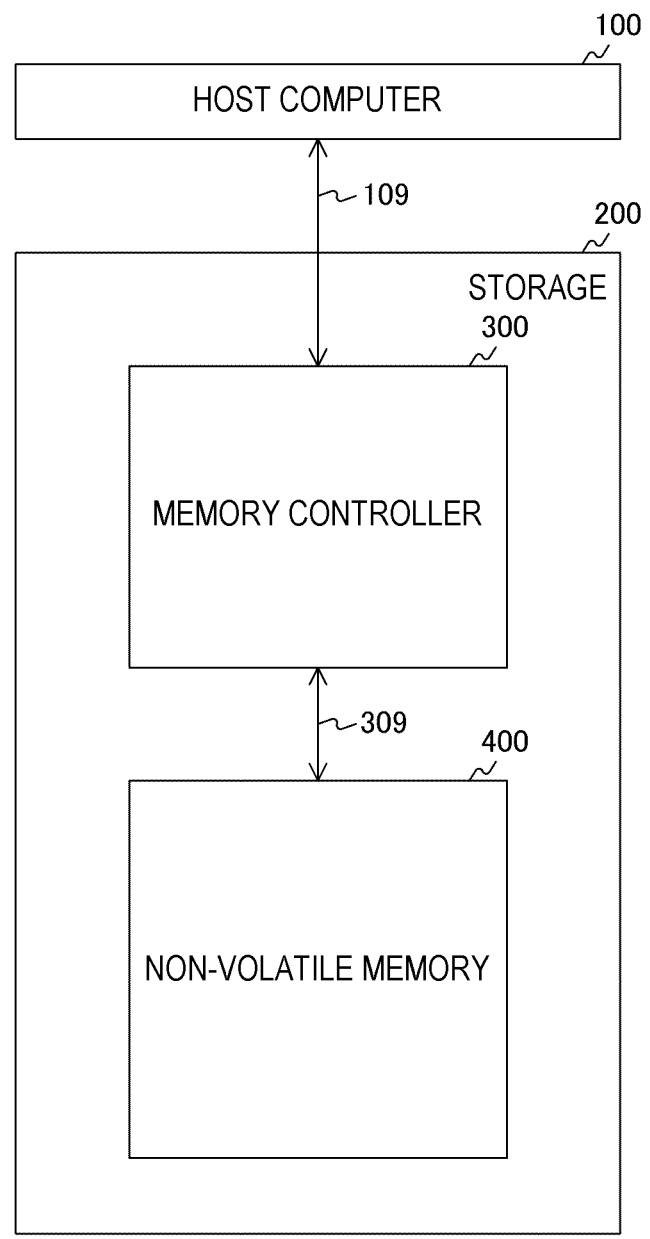
FIG. 1 is an overall diagram illustrating an example of a configuration of a memory system according to a first embodiment of the present technology.

FIG. 1 is an overall diagram illustrating an example of a configuration of a memory system according to a first embodiment. The memory system includes a host computer 100 and a storage 200.

The host computer 100 controls an overall memory system. Specifically, the host computer 100 generates commands and data and supplies them to the storage 200 via a signal line 109. In addition, the host computer 100 receives read data from the storage 200 via the signal line 109. Here, the commands are for controlling the storage 200 and include, for example, a write command instructing writing of data and without a read command instructing reading of data.

The storage 200 includes a memory controller 300 and a non-volatile memory 400. The memory controller 300 controls the non-volatile memory 400. In a case in which a write command and data are received from the host computer 100, the memory controller 300 encodes the data. Hereinafter, data before encoding is referred to as "original data." Then, the memory controller 300 accesses the non-volatile memory 400 via a signal line 309 and writes the encoded data.

Further, in a case in which a read command is received from the host computer 100, the memory controller 300 accesses the non-volatile memory 400 via the signal line 308 and reads the encoded data via the signal line 309. Then, the memory controller 300 converts (for example, decodes) the encoded data into the original data before the encoding. The memory controller 300 supplies the decoded data to the host computer 100.

The non-volatile memory 400 stores data under the control of the memory controller 300. For example, a ReRAM is used as the non-volatile memory 400. The non-volatile memory 400 includes a plurality of memory cells arranged in a two-dimensional lattice pattern.

[Example of Configuration of Memory Controller]

Figure 2:
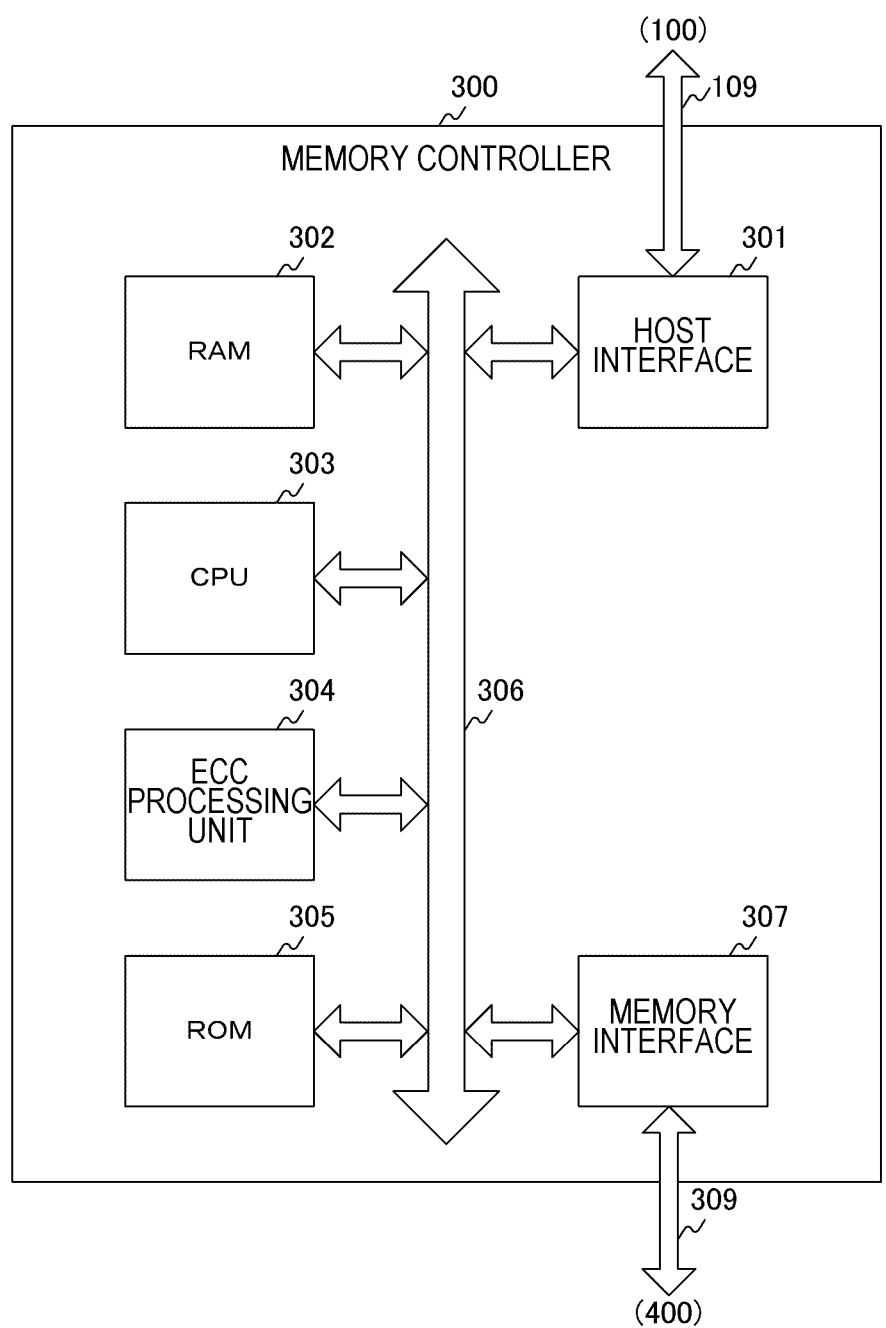
FIG. 2 is a block diagram illustrating an example of a configuration of a memory controller according to the first embodiment of the present technology.

FIG. 2 is a block diagram illustrating an example of a configuration of the memory controller 300 according to the first embodiment. The memory controller 300 includes a host interface 301, a random access memory (RAM) 302, and a central processing unit (CPU) 303. In addition, the memory controller 300 includes an ECC (Error detection and Correction Code) processing unit 304, a read only memory (ROM) 305, a bus 306, and a memory interface 307.

The host interface 301 is for exchanging data and commands with the host computer 100. The RAM 302 temporarily holds data necessary for processes executed by the CPU 303. The CPU 303 entirely controls the memory controller 300. The ROM 305 stores programs executed by the CPU 303 and the like. The bus 306 is a shared path for exchanging data between the RAM 302, the CPU 303, the ECC processing unit 304, the ROM 305, the host interface 301, and the memory interface 307. The memory interface 307 is for exchanging data and commands with the non-volatile memory 400.

The ECC processing unit 304 encodes or decodes data. In the encoding, the ECC processing unit 304 performs the encoding in predetermined units by adding a parity to ECC encoded target data. An individual piece of data encoded in a predetermined unit is called a "code word." Then, the ECC processing unit 304 supplies the encoded data to the non-volatile memory 400 as the write data via the bus 306.

Further, the ECC processing unit 304 decodes the encoded read data into the original data. In the decoding, the ECC processing unit 304 performs detection and correction of an error in the read data using the parity.

Figure 3:
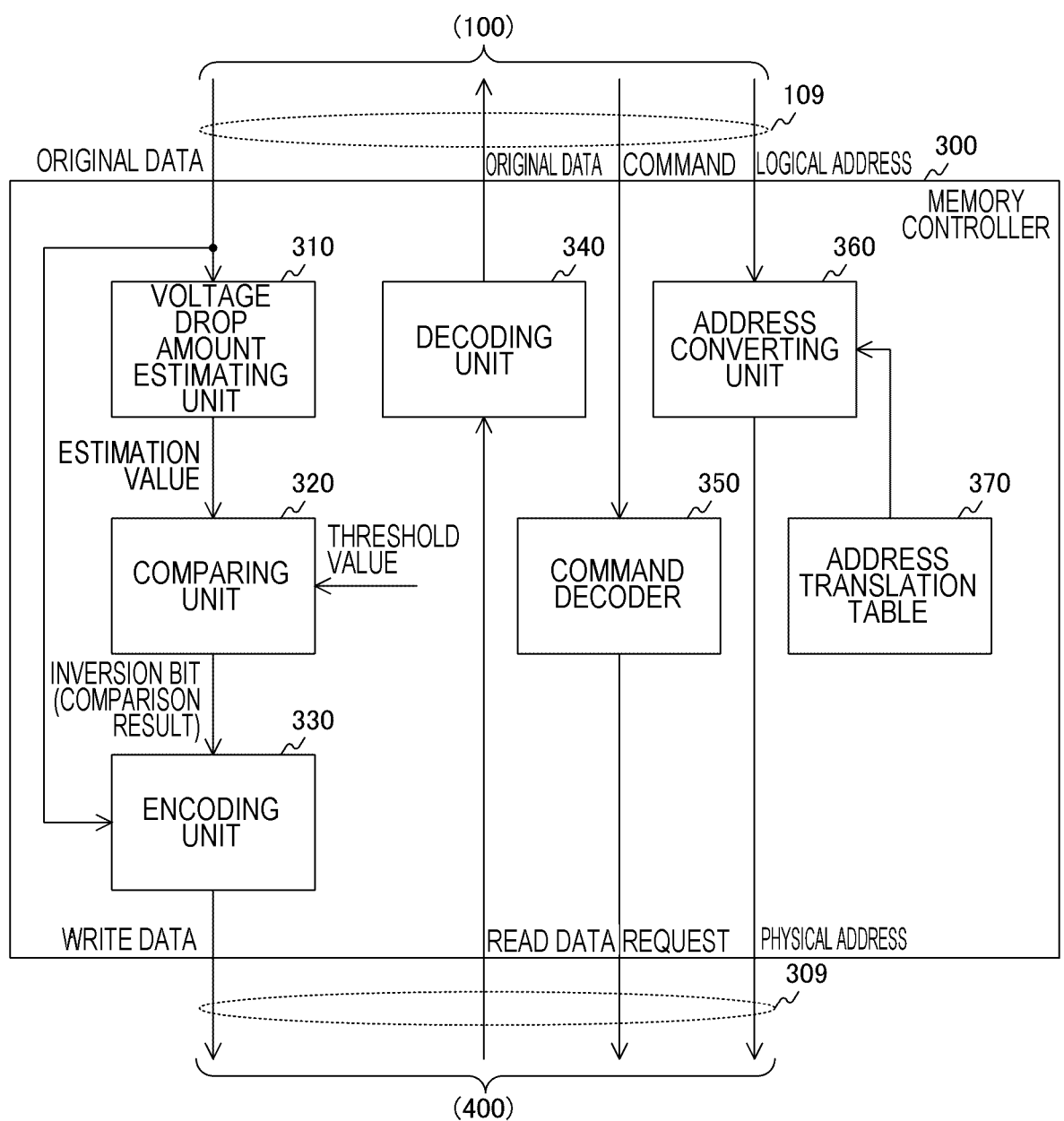
FIG. 3 is a block diagram illustrating an example of a functional configuration of the memory controller according to the first embodiment of the present technology.

FIG. 3 is a block diagram illustrating a functional configuration example of the memory controller 300 in the first embodiment. The memory controller 300 includes a voltage drop amount estimating unit 310, a comparing unit 320, an encoding unit 330, a decoding unit 340, a command decoder 350, an address converting unit 360, and an address translation table 370. The respective units are implemented by the host interface 301, the RAM 302, the CPU 303, the ECC processing unit 304, the ROM 305, the bus 306, the memory interface 307, and the like of FIG. 2.

The voltage drop amount estimating unit 310 estimates an amount of the voltage drop (IR drop) from the leakage current when the original data is held in the memory cell and a wiring resistance of a wiring to the memory cell. Further, the comparing unit 320 compares an estimation value of the IR drop with a predetermined threshold value.

Here, as described above, in the ReRAM, the leakage current increases as the resistance value of the memory cell decreases. For this reason, for example, if the resistance value of the memory cell holding "1" of the binary number is smaller than that of the memory cell holding "0," the leakage current of the memory cell of "1" becomes larger. Hereinafter, the leakage current of the memory cell of "1" is indicated by $I_{LEAK}$, and the leakage current of the memory cell of "0" is assumed to be small enough to be negligible.

Further, the wiring resistance of the wiring to the memory cell increases as the wiring distance increases. For example, the original data has 8 bits, a memory cell corresponding to a first bit has the smallest wiring distance, and a memory cell corresponding to a last bit has the largest wiring distance. In this case, as the bit gets closer to the last bit, the wiring resistance of the wiring to the memory cell corresponding to the bit increases. Therefore, the wiring resistance corresponding to the memory cell of an n-th bit (n is an integer of 0 to 7) from the head can be indicated by $(n+1) \times R_0$. Here, $R_O$ is the wiring resistance of the wiring between adjacent memory cells. From this wiring resistance and leakage current, an IR drop $V_{DROP}$ of a memory cell in which original data is written can be obtained by the following Formula on the basis of the wiring resistance and the leakage current.

[Math. 1]

$$V_{DROP} = \sum_{n=0}^{7} I_n \times \{(n+1) \times R_o\} \quad \text{Formula 1}$$

In Formula 1, $I_n$ is the leakage current of the memory cell holding the n-th bit from the head. For example, in a case in which the n-th bit is "1," a value of $I_{LEAK}$ is used as the leakage current L of the memory cell holding the bit. On the other hand, in a case in which the n-th bit is "0," a value of "0" is used as the leakage current $I_n$ of the memory cell holding the bit.

For example, the IR drop $V_{DROP}$ of Formula 1 is compared with the threshold value $I_{LEAK}$ (Th×$R_0$). Here, Th is a predetermined real number. It is obtained by the following Formula 2 whether or not the IR drop $V_{DROP}$ exceeds the threshold value.

[Math. 2]

$$I_{LEAK}(Th \times R_o) < \sum_{n=0}^{7} I_n \times \{(n+1) \times R_o\} \quad \text{Formula 2}$$

Since $I_n$ is $I_{LEAK}$ or "0," Formula 2 can be simplified to the following equation.

[Math. 3]

$$Th < \sum_{n=0}^{7} b_n \times (n+1) = \sum_{n=0}^{7} b_n k_n \quad \text{Formula 3}$$

In Formula 3, $b_n$ is the value of the n-th bit. $k_n$ is a weight coefficient corresponding to $b_n$. A right side (the IR drop) of Formula 3 is obtained by weighted addition of the bit $b_n$ and the weight coefficient $k_n$. The weight coefficient of each bit is held in a reference table or the like in the memory controller 300 in advance. Further, the weight coefficient may be held in the non-volatile memory 400 instead of the memory controller 300, and the memory controller 300 may read the weight coefficient, for example, when the system is activated.

The voltage drop amount estimating unit 310 calculates the right side of Formula 3 by the weighted addition and supplies a calculated value to the comparing unit 320 as the estimation value of the IR drop. Then, the comparing unit 320 compares the estimation value with the threshold value Th and supplies a bit indicating a comparison result to the encoding unit 330 as an inversion bit. The inversion bit indicates whether or not the original data is inverted. For example, in a case in which the estimation value of the IR drop exceeds a predetermined threshold value, a value of "1" indicating that the original data is inverted is set as the inversion bit, and in a case in which the estimation value is equal to or smaller than a predetermined threshold value, a value of "0" indicating that the original data is not inverted is set as the inversion bit.

The encoding unit 330 encodes the original data. The encoding unit 330 performs a process of inverting the original data on the basis of the inversion bit and a process of generating the parity. In a case in which the inversion bit is "1," the encoding unit 330 inverts the original data and generates inversion data. On the other hand, in a case in which the inversion bit is "0," the encoding unit 330 does not invert the original data. Data including the original data or the inversion data generated by the inversion encoding process and the inversion bit is hereinafter referred to as "ECC encoded target data."

Then, the encoding unit 330 generates the parity used for detecting and correcting the error of the ECC encoded target data on the basis of the ECC encoded target data. The encoding unit 330 supplies the data including the ECC encoded target data and the parity to the non-volatile memory 400 as the write data.

Further, the encoding unit 330 performs the encoding in units of 8 bits, but the unit for encoding is not limited to 8 bits.

The decoding unit 340 decodes the read data from the non-volatile memory 400. This decoding unit 340 executes a process corresponding to the process in the encoding unit 330 and decodes the original data. Then, the decoding unit 340 supplies the decoded original data to the host computer 100.

The command decoder 350 decodes a command from the host computer 100 and generates a request. The command decoder 350 supplies the generated request to the non-volatile memory 400.

The address converting unit 360 converts a physical address and a logical address into each other with reference to the address translation table 370. Here, the logical address is an address which is allocated to each region of an access unit when the host computer 100 accesses the storage 200 in an address space defined by the host computer 100. Further, the physical address is an address which is allocated to each access unit in the non-volatile memory 400 as described above. Further, the address converting unit 360 is an example of the address generating unit stated in the claims set forth below.

The address translation table 370 is a table in which the logical addresses and the physical addresses are associated with each other.

[Configuration Example of Voltage Drop Amount Estimating Unit]

Figure 4:
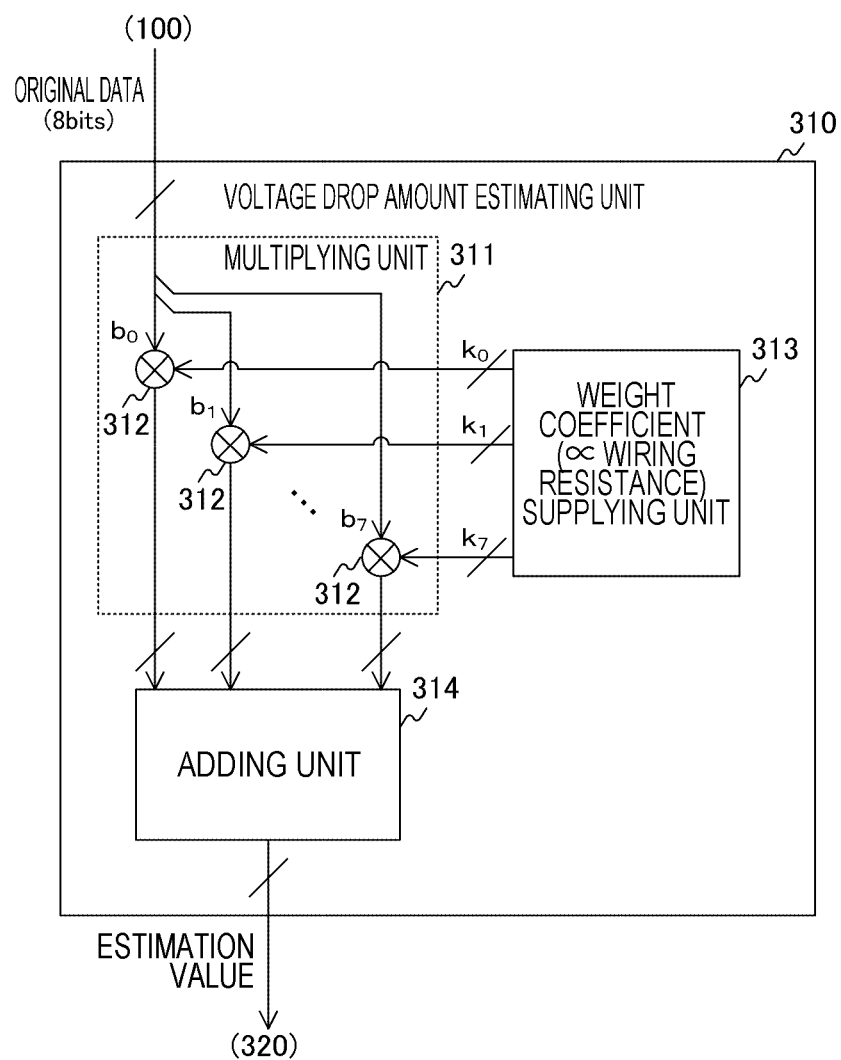
FIG. 4 is a block diagram illustrating a configuration example of a voltage drop amount estimating unit in the first embodiment of the present technology.

FIG. 4 is a block diagram illustrating a configuration example of the voltage drop amount estimating unit 310 in the first embodiment. The voltage drop amount estimating unit 310 includes a multiplying unit 311, a weight coefficient supplying unit 313, and an adding unit 314.

The multiplying unit 311 multiplies the bit by the weight coefficient in units of bits. The multiplying unit 311 includes a plurality of multipliers 312. An n-th multiplier 312 multiplies the bit $b_n$ by the weight coefficient $k_n$ and supplies the multiplication result to the adding unit 314.

The weight coefficient supplying unit 313 supplies the weight coefficient to each of the bits. The weight coefficient supplying unit 313 supplies the weight coefficient $k_n$ to the n-th multiplier 312.

The adding unit 314 adds the respective multiplication results of the multipliers 312. The adding unit 314 supplies an addition result to the comparing unit 320 as the estimation value of the IR drop.

[Configuration Example of Encoding Unit]

Figure 5:
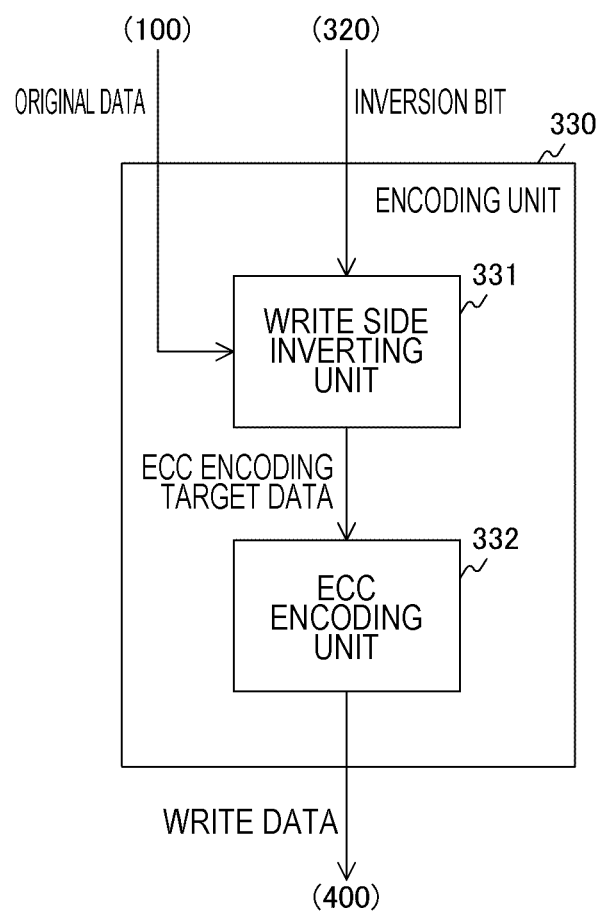
FIG. 5 is a block diagram illustrating a configuration example of an encoding unit in the first embodiment of the present technology.

FIG. 5 is a block diagram illustrating a configuration example of the encoding unit 330 in the first embodiment. The encoding unit 330 includes a write side inverting unit 331 and an ECC encoding unit 332.

The write side inverting unit 331 inverts the original data on the basis of the inversion bit. In a case in which the inversion bit is "1," the write side inverting unit 331 inverts the original data and supplies the inversion data and the inversion bit to the ECC encoding unit 332 as the ECC encoded target data. On the other hand, in a case in which the inversion bit is "0," the write side inverting unit 331 supplies the original data and the inversion bit to the ECC encoding unit 332 as the ECC encoded target data without inverting the original data. Data (that is, the original data or the inversion data) other than the inversion bit in this ECC encoded target data is hereinafter referred to as "non-management information." Further, the inversion process by the write side inverting unit 331 is hereinafter referred to as "inversion encoding."

The ECC encoding unit 332 generates the parity used for detecting and correcting the error of the ECC encoded target data on the basis of the ECC encoded target data. The ECC encoding unit 332 supplies an error detection and correction code (ECC) including the ECC encoded target data and the parity to the non-volatile memory 400 as the write data. For example, a Bose Chaudhuri Hocquenghem (BCH) code, a Reed-Solomon (RS) code, or the like is used as the ECC. Hereinafter, data including the inversion bit and the parity is referred to as "management information." Further, encoding to the ECC is hereinafter referred to as "ECC encoding."

[Configuration Example of Decoding Unit]

Figure 6:
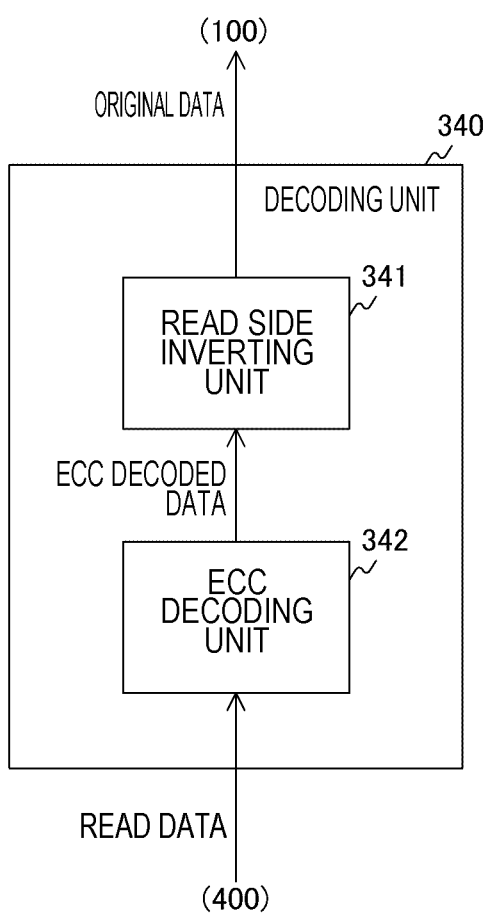
FIG. 6 is a block diagram illustrating a configuration example of a decoding unit in the first embodiment of the present technology.

FIG. 6 is a block diagram illustrating a configuration example of the decoding unit 340 in the first embodiment. The decoding unit 340 includes a read side inverting unit 341 and an ECC decoding unit 342.

The ECC decoding unit 342 decodes the read data. The ECC decoding unit 342 acquires the ECC from the non-volatile memory 400 as the read data. Then, the ECC decoding unit 342 detects the presence or absence of an error of the ECC encoded target data using the parity in the ECC, and corrects the error in a case in which there is an error. Then, the ECC decoding unit 342 supplies data obtained by detecting the correcting the error to the read side inverting unit 341 as ECC decoded data. The ECC decoded data includes the non-management information (the original data or the inversion data) and the inversion bit.

The read side inverting unit 341 inverts the non-management information on the basis of the inversion bit. In a case in which the inversion bit is "1," the read side inverting unit 341 inverts the non-management information and supplies the inverted non-management information to the host computer 100 as the original data. On the other hand, in a case in which the inversion bit is "0," the read side inverting unit 341 supplies the host computer 100 as the original data without inverting the non-management information.

[Configuration Example of Non-Volatile Memory]

Figure 7:
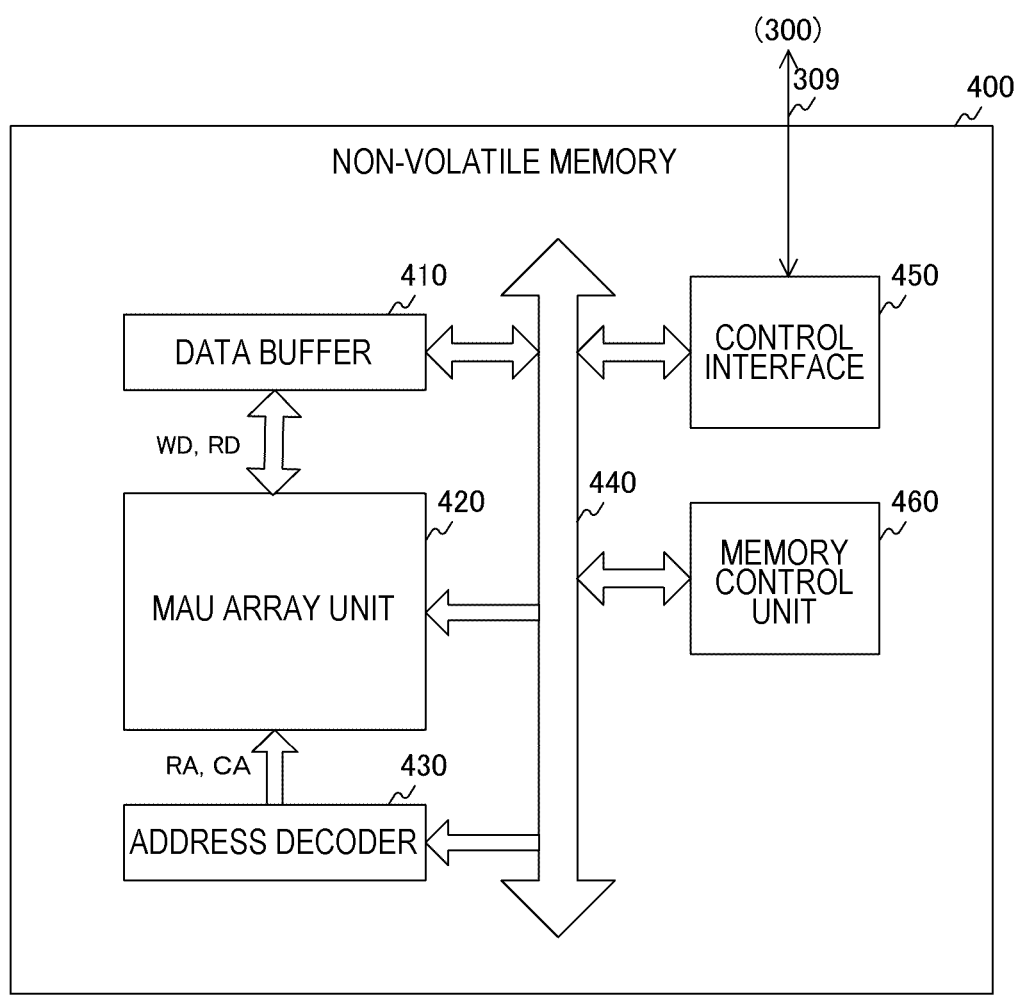
FIG. 7 is a block diagram illustrating an example of a configuration of a non-volatile memory according to the first embodiment of the present technology.

FIG. 7 is a block diagram illustrating a configuration example of the non-volatile memory 400 in the first embodiment. The non-volatile memory 400 includes a data buffer 410, an MAU array unit 420, an address decoder 430, a bus 440, a control interface 450, and a memory control unit 460.

The data buffer 410 holds the write data and the read data under the control of the memory control unit 460.

The MAU array unit 420 includes a plurality of memory array units disposed therein. A memory cell array and a driver are disposed in each of the memory array units.

The address decoder 430 decodes an address designated by the request. The address decoder 430 generates a row address RA and a column address CA by decoding the address and supplies the row address RA and the column address CA to the MAU array unit 420.

The bus 440 is a common path in which the data buffer 410, the MAU array unit 420, the address decoder 430, the control interface 450, and the memory control unit 460 exchange data with one another. The control interface 450 is an interface for the memory controller 300 and the non-volatile memory 400 to exchange data and commands with each other.

The memory control unit 460 controls the memory array unit such that data is written or read.

Figure 8:
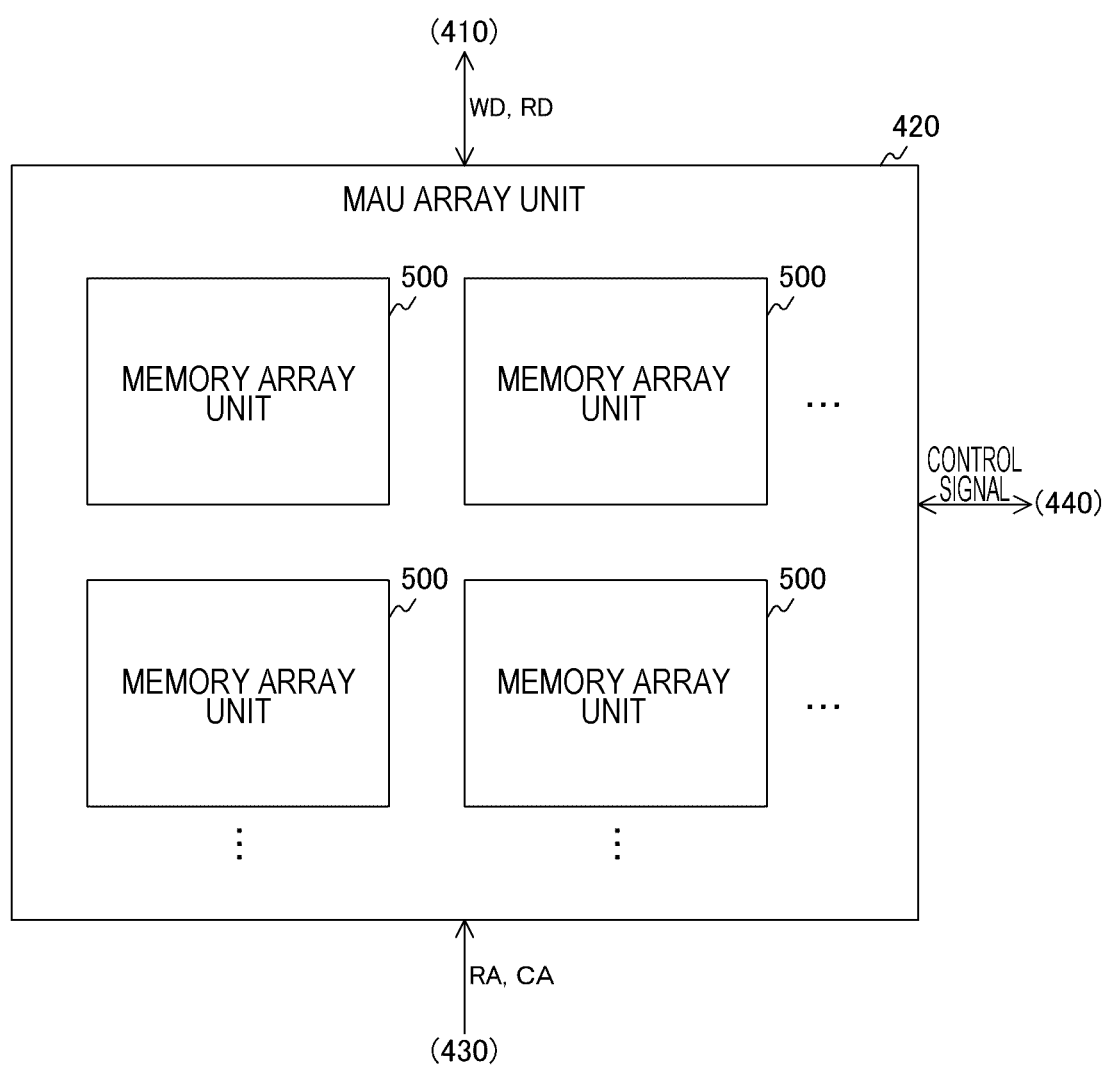
FIG. 8 is a block diagram illustrating a configuration example of an MAU array unit in the first embodiment of the present technology.

FIG. 8 is a diagram illustrating a configuration example of the MAU array unit 420 in the first embodiment. A plurality of memory array units 500 are arranged in the MAU array unit 420.

[Configuration Example of Memory Array Unit]

Figure 9:
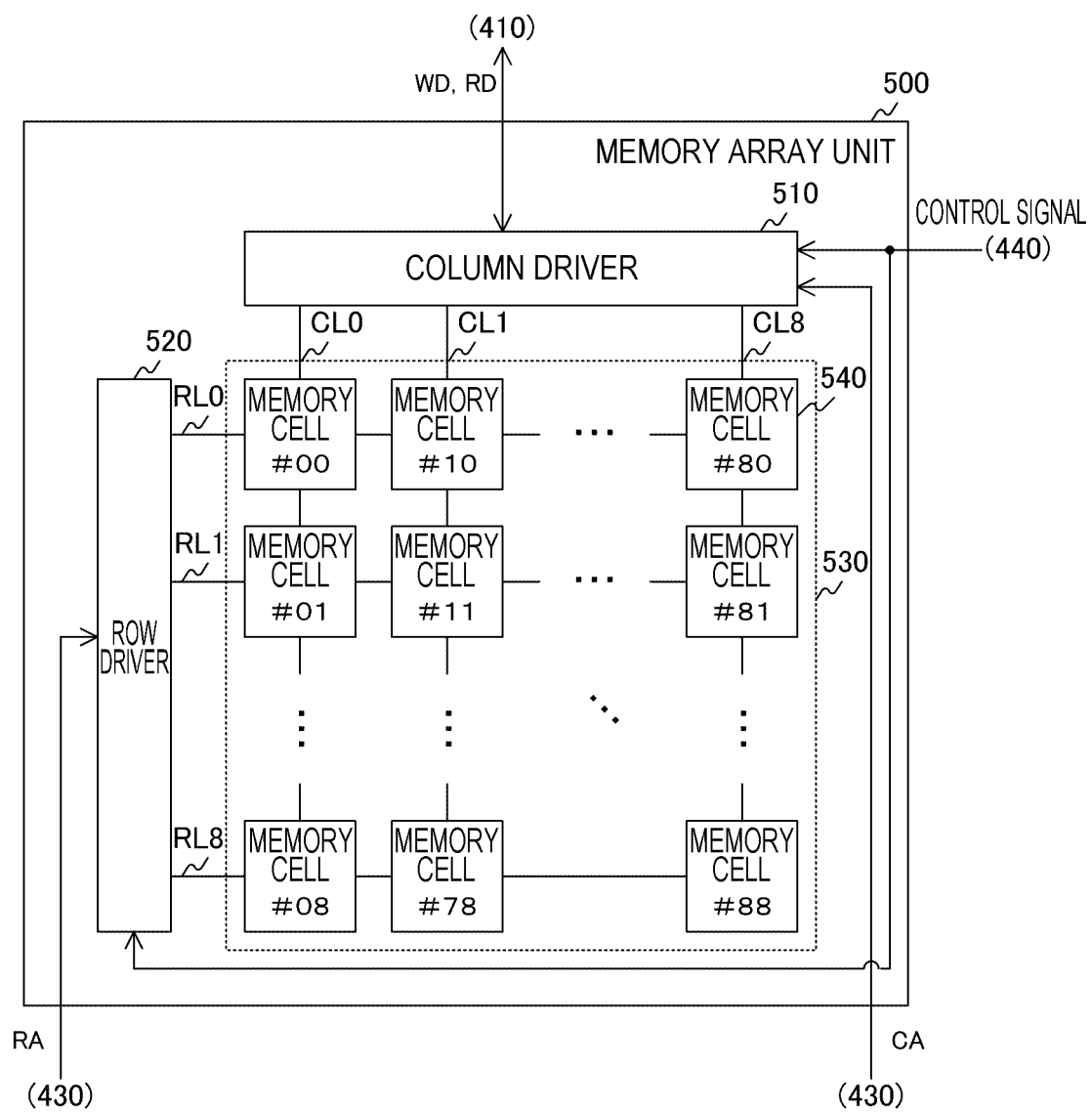
FIG. 9 is a block diagram illustrating a configuration example of a memory array unit in the first embodiment of the present technology.

FIG. 9 is a block diagram illustrating a configuration example of the memory array unit 500 in the first embodiment. The memory array unit 500 includes a column driver 510, a row driver 520, and a memory cell array 530. The memory cell array 530 includes a plurality of memory cells 540 which are arranged in a two-dimensional lattice pattern. Hereinafter, a set of memory cells 540 arranged in a predetermined direction are referred to as a "row," and a set of memory cells 540 arranged in a direction perpendicular to the direction is referred to as a "column."

The write data is assumed to be written in access units called blocks. The block includes, for example, a predetermined number of memory cells 540 arranged in the row direction.

The memory cell 540 stores data. Each memory cell 540 is connected to a column line wired in a column direction and a row line wired in a row direction. For example, a total of 64 (=8×8) memory cells 540 are disposed. Further, each of the memory cells 540 belonging to a p-th row (p is an integer of 0 to 7) is connected to the row driver 520 via a row line RLp. Further, each of the memory cells 540 belonging to a q-th column (q is an integer of 0 to 7) is connected to the column driver 510 via a column line CLq. Further, the number of memory cells 540 is not limited to 16.

Further, for example, an address of "pq" is allocated to memory cell 540 connected to a row line RLp and a column line CLq.

The row driver 520 drives the rows in accordance with the row address RA from the address decoder 430 and the control signal from the memory control unit 460. Here, the row address RA indicates a position of a row to be accessed. Further, the control signal is a set signal, a reset signal, or a sense signal.

The column driver 510 drives the rows on the basis of the column address CA from the address decoder 430, the control signal, and write data WD. Here, the column address CA indicates a position of a column to be accessed. Further, the column driver 510 reads read data RD in accordance with the sense signal and causes the read data RD to be held in in the data buffer 410.

With regard to writing, the row driver 520 applies a selected row voltage to a row selected on the basis of the row address RA and applies an unselected row voltage to the other rows. Further, the column driver 510 applies a selected column voltage to a column selected on the basis of the column address CA, and applies an unselected column voltage to the other columns.

Here, the memory cell 540 belonging to both a selected row and a selected column is hereinafter referred to as a "selected cell." Further, the memory cell 540 belonging to a selected row and an unselected column is referred to as a "half-selected cell." The memory cell 540 belonging to an unselected row and an unselected column is referred to as an "unselected cell."

A line voltage of the difference between the selected row voltage and the selected column voltage is applied to both ends of the selected cell. It is possible to set, reset, or sense the selected cell by controlling a size and a polarity of this line voltage. Hereinafter, the line voltage at the time of setting is referred to as a "set voltage," the line voltage at the time of resetting is referred to as a "reset voltage," and the line voltage at the time of sensing is referred to as a "sense voltage."

Figure 10:
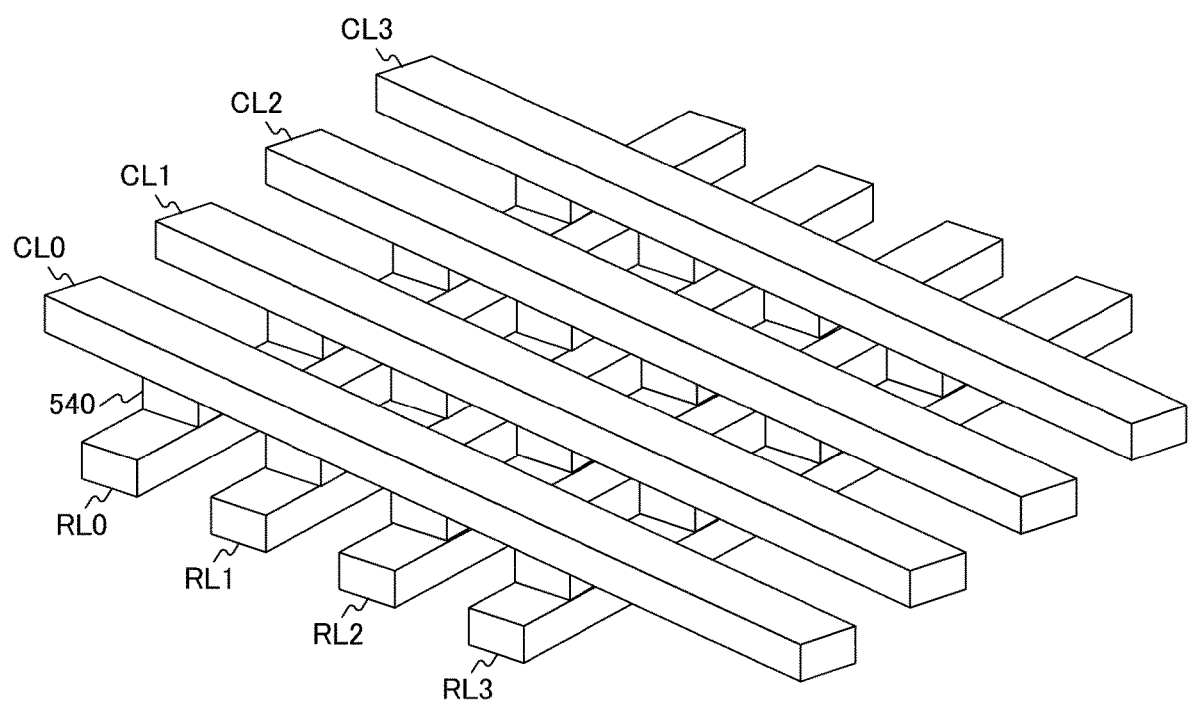
FIG. 10 is a perspective view of a memory cell array in the first embodiment of the present technology.

FIG. 10 is a perspective view of the memory cell array 530 in the first embodiment. In the memory cell array 530, a wiring layer in which the column line CLq and the like are disposed and a wiring layer in which the row line RLp and the like are disposed are stacked on a semiconductor substrate. Further, at the intersection points of the row lines and the column lines, the memory cells 540 are arranged at positions interposed between the column line and the row lines. Such a non-volatile memory is called a cross point type memory.

[Configuration Example of Memory Cell]

Figure 11:
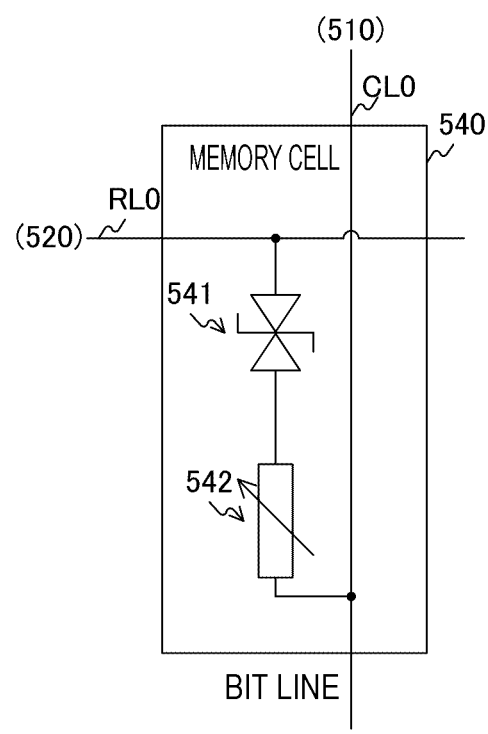
FIG. 11 is a circuit diagram illustrating a configuration example of a memory cell in the first embodiment of the present technology.

FIG. 11 is a circuit diagram illustrating a configuration example of the memory cell 540 in the first embodiment. The memory cell 540 includes a bidirectional diode 541 and a variable resistive element 542. One end of the bidirectional diode 541 is connected to the row line RLo, and the other end is connected to the variable resistive element 542. One end of the variable resistive element 542 is connected to the bidirectional diode 541, and the other end is connected to the column line CL0.

The bidirectional diode 541 supplies an electric current according to a line voltage between the column line and the bit line. For example, in a case in which the line voltage exceeds a predetermined value, the bidirectional diode 541 transitions to a conduction state and causes an electric current exceeding a predetermined current threshold I-th to flow to the variable resistive element 542. On the other hand, in a case in which the line voltage is equal to or less than a predetermined value, the bidirectional diode 541 transitions to a non-conduction state and causes an electric current equal to or less than the current threshold I-th to flow to the variable resistive element 542. The variable resistive element 542 is an element whose resistance value varies in accordance with a direction of an electric current. Further, an element other than the bidirectional diode 541 (such as a transistor) may be disposed instead of the bidirectional diode 541 as long as it is a selection element that transitions from one of the conduction state and the non-conduction state to the other in accordance with the line voltage.

Figure 12:
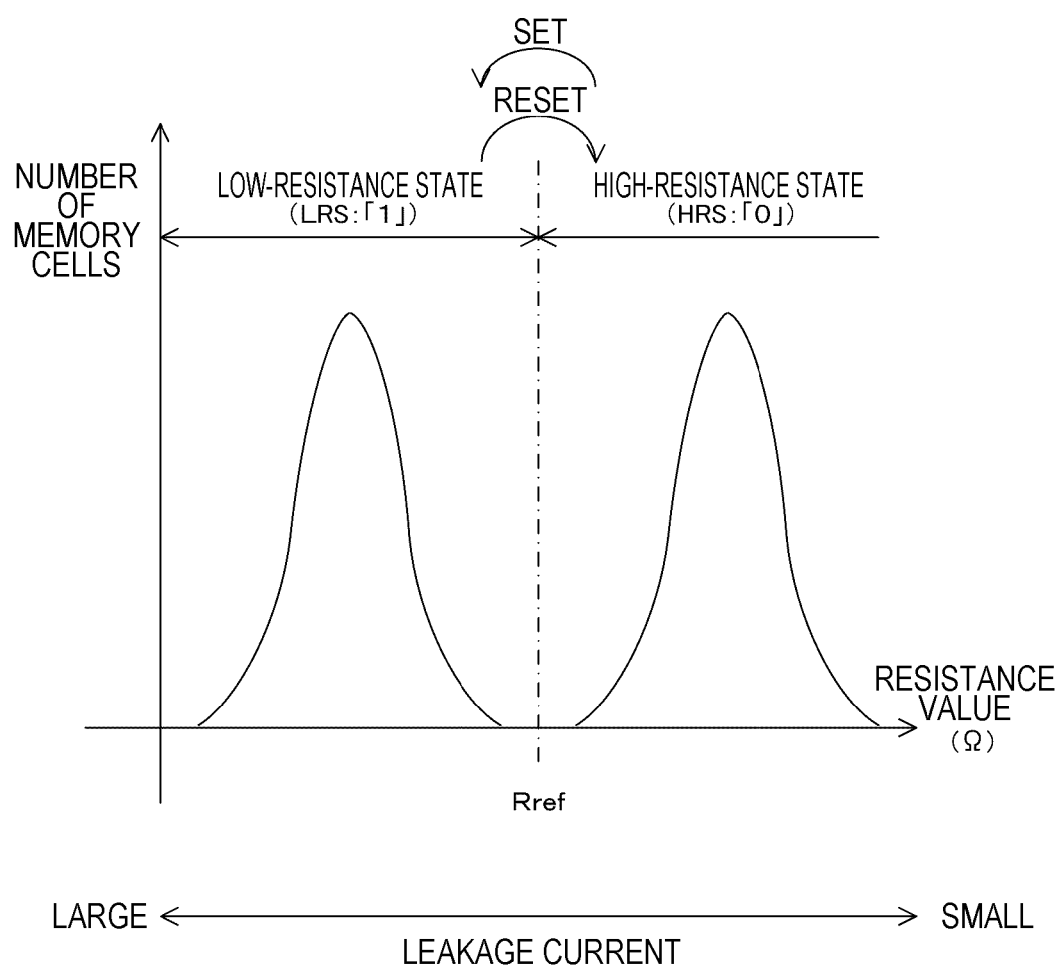
FIG. 12 is a diagram illustrating an example of a resistance distribution of a variable resistive element in the first embodiment of the present technology.

FIG. 12 is a diagram illustrating an example of a resistance distribution of the variable resistive element 542 in the first embodiment. In FIG. 11, a vertical axis indicates the number of cells of the memory cell 540, and a horizontal axis indicates a resistance value. In the memory cell 540, the resistance distribution thereof is divided into two by a resistance threshold $R_{ref}$. The distributions are called a low-resistance state (LRS) and a high-resistance state (HRS). For example, a logic value of "1" is allocated to the LRS, and "0" is allocated to the HRS. Further, a process of causing the memory cell 540 of the LRS to transition to the HRS is hereinafter referred to as "reset," and a process of causing the memory cell 540 of the HRS to transition to the LRS is hereinafter referred to as "set." Further, reading a value held in the memory cell 540 is referred to as "sense."

Here, the leakage current flowing in the memory cell 540 generally increases as the resistance value of the variable resistive element 542 in the memory cell 540 decreases. In other words, the leakage current of the memory cell 540 of the LRS is larger than that of the HRS.

Further, "1" is allocated to the LRS, and "0" is allocated to the HRS, but conversely, "0" may be allocated to the LRS, and "1" may be allocated to the HRS. In this case, in the voltage drop amount estimating unit 310, the value obtained by inverting the bit $b_n$ and the weight coefficient $k_n$ undergo the weighted addition.

Figure 13A:
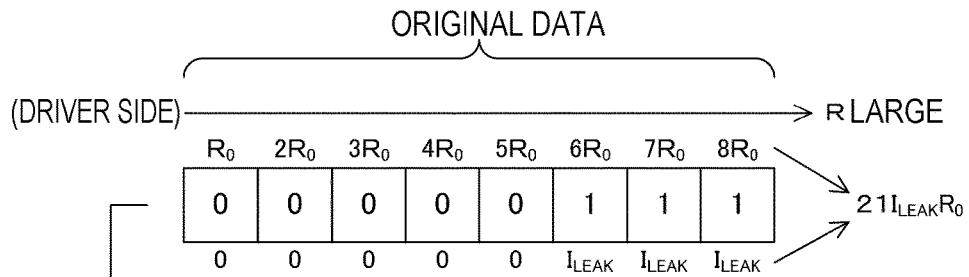
FIGS. 13A, 13B, 13C, and 13D are diagrams illustrating an example of data before and after encoding in the first embodiment of the present technology.
Figure 13B:
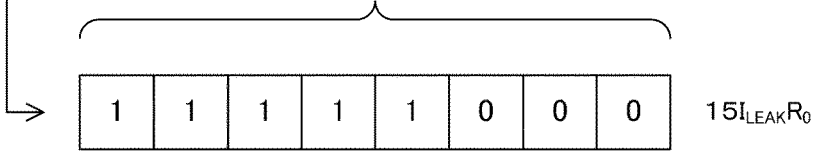
Figure 13C:
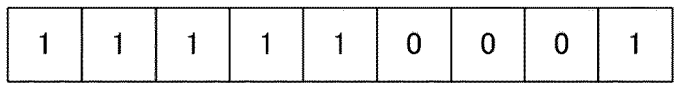

FIGS. 13A, 13B, 13C, and 13D are diagrams illustrating an example of data before and after encoding in the first embodiment. FIG. 13A is a diagram illustrating an example of the original data, and FIG. 13B is a diagram illustrating an example of the inversion data. Further, FIG. 13C is a diagram illustrating an example of the ECC encoded target data, and FIG. 14D is a diagram illustrating an example of the write data.

First, the memory controller 300 estimates the IR drop in a case in which the original data is held in the memory cell without being inverted. If the original data is indicated by "00000111" of a binary number, the leakage current $I_{LEAK}$ occurs in 5-th to 7-th bits of the LRS. Therefore, the IR drop is estimated to be 21 $I_{LEAK}R_0$ from Formula 1. In a case in which Formula 3 simplified is used, "21" is calculated as the estimation value.

Here, for example, the threshold value Th is assumed to be set to "18" (ILEAKR0). In this case, since the estimation value of the IR drop exceeds the threshold value Th, the memory controller 300 inverts the original data and generates the inversion data "11111000" as illustrated in FIG. 13B. The IR drop of the inversion data is assumed to be 15 ILEAKR0 from Formula 1. As described above, due to the inversion, the IR drop decreases as compared with before the inversion.

Figure 13D:
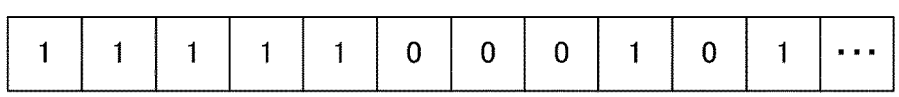

Then, as illustrated by FIG. 13D, the memory controller 300 uses the inversion bit in which "1" is set and the inversion data (non-management information) as the ECC encoded target data, and generates the parity as illustrated in FIG. 13D. As described above, the write data including the non-management information (the original data or the inversion data) and the management information (the inversion bit and the parity) is written in the memory cell.

Figures 14A, 14B:
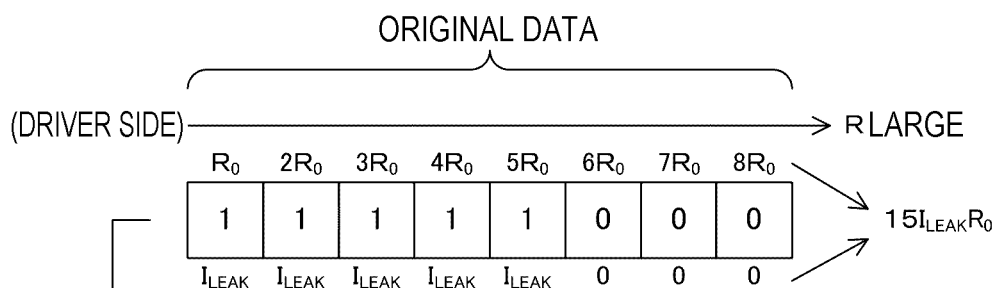
FIGS. 14A and 14B are diagrams illustrating an example of data before and after encoding in a comparative example.

FIGS. 14A and 14B are diagrams illustrating an example of data before and after encoding in a comparative example. In the comparative example, the memory system is assumed to invert the original data in a case in which the number of "1s" exceeds a threshold value (for example, "4"). FIG. 14A is a diagram illustrating an example of the original data, and FIG. 14B is a diagram illustrating an example of the inversion data.

In a case in which the original data is "11111000," the memory system of the comparative example inverts the original data because the number of "1s" exceeds the threshold value, and generates the inversion data "00000111." The IR drop when the original data is written before the inversion is 15 $I_{LEAK}R_0$ from Formula 1. On the other hand, the IR drop when the inversion data is written is 21 $I_{LEAK}R_0$ from Formula 1, and the IR drop increases due to the inversion.

On the other hand, the memory controller 300 estimates the IR drop, and in a case in which the estimation value exceeds the threshold value, the memory controller 300 inverts the original data and reduces the IR drop to be below the threshold value, and thus the increase in the IR drop can be suppressed.

Since the increase in the IR drop is suppressed, an error occurrence rate at a low voltage can be reduced. Further, the margin of the power voltage can be increased. Further, it is possible to reduce the delay time necessary for writing and increasing the write bandwidth while maintaining the margin. Further, it is possible to reduce a cost per bit while maintaining the margin due to the size reduction of the memory cell, the increase in the number of stacked memory cells, and the like.

[Operation Example of Memory Controller]

Figure 15:
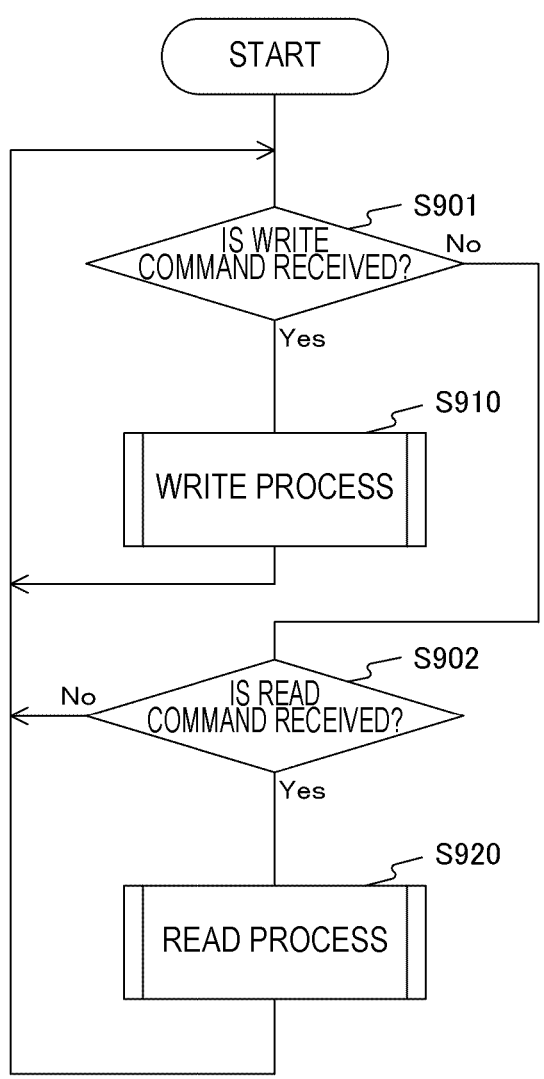
FIG. 15 is a flowchart illustrating an example of an operation of a memory controller in the first embodiment of the present technology.

FIG. 15 is a flowchart illustrating an example of an operation of the memory controller 300 in the first embodiment. This operation is started, for example, when the memory system is powered on.

The memory controller 300 determines whether or not a write command is received from the host computer 100 (step S901). In a case in which the write command is received (Yes in step S901), the memory controller 300 executes a write process for writing the write data (step S910).

In a case in which the write command has not been received (No in step S901), the memory controller 300 determines whether or not a read command is received (step S902). In a case in which the read command is received (Yes in step S902), the memory controller 300 executes a read process for reading the read data (step S920).

In a case in which the read command is not received (No in step S902), the memory controller 300 repeats step S901 and subsequent steps after step S910 or S920.

Figure 16:
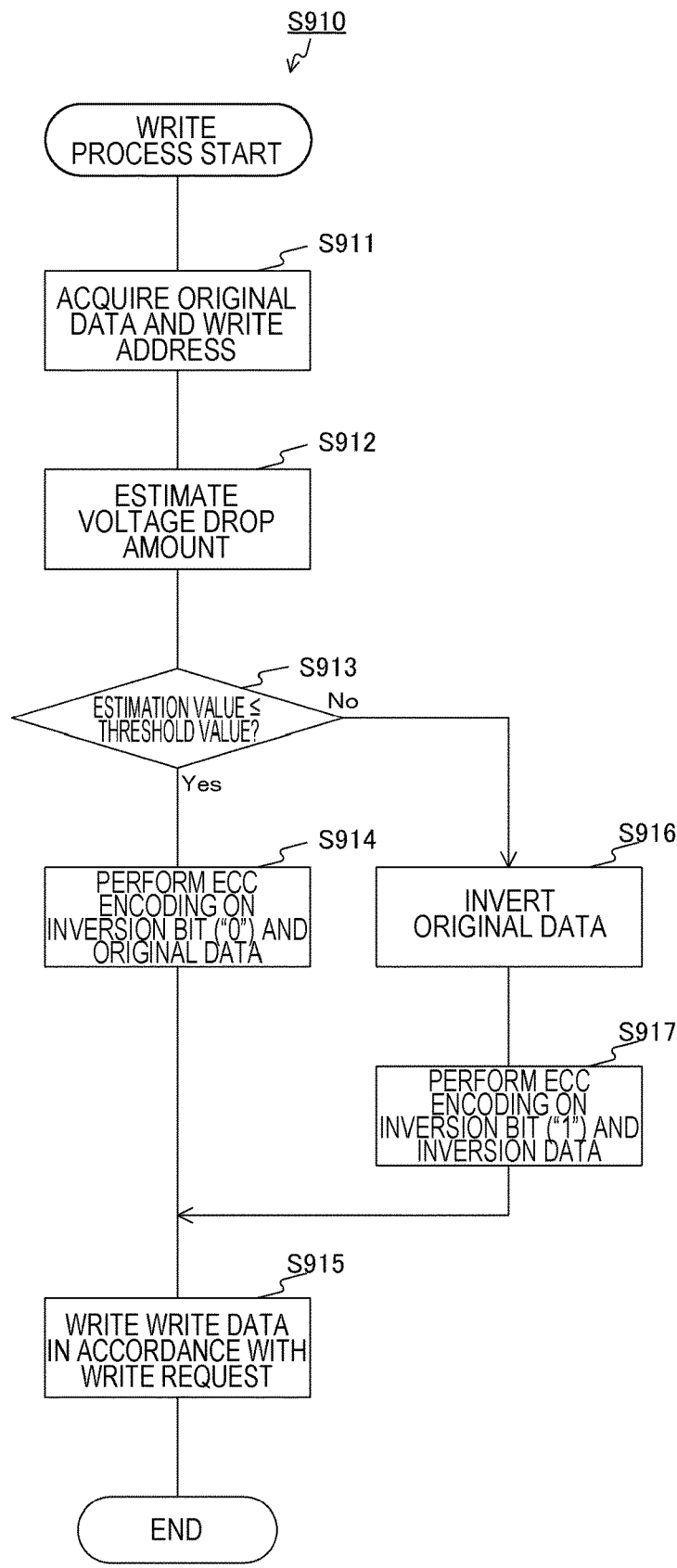
FIG. 16 is a flowchart illustrating an example of a write process in the first embodiment of the present technology.

FIG. 16 is a flowchart illustrating an example of the write process in the first embodiment. The memory controller 300 acquires the original data and the write address (step S911) and estimates the voltage drop amount by the weighted addition of the bit $b_n$ and the weight coefficient $k_n$ (step S912).

The memory controller 300 determines whether or not the estimation value of the voltage drop amount is equal to or less than a threshold value (step S913). In a case in which the estimation value is equal to or less than the threshold value (Yes in step S913), the memory controller 300 encodes the inversion bit of "0" and the original data to the ECC (step S914). On the other hand, in a case in which the estimation value exceeds the threshold value (No in step S913), the memory controller 300 inverts the original data (step S916) and encodes the inversion bit of "1" and the inversion data to the ECC (step S917).

After step S914 or S917, the memory controller 300 writes the encoded write data to the non-volatile memory 400 in accordance with the write request (step S915).

Figure 17:
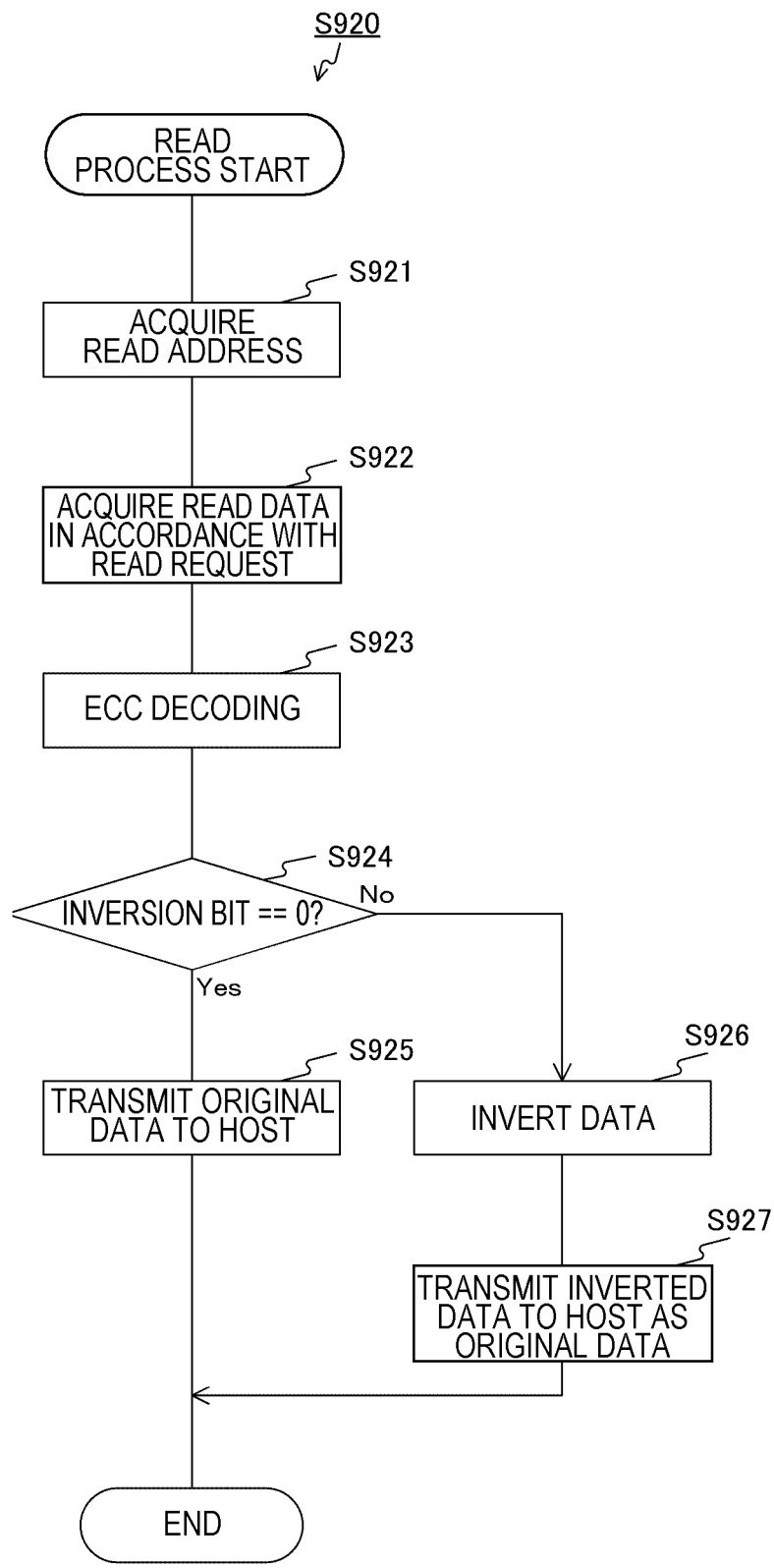
FIG. 17 is a flowchart illustrating an example of a read process in the first embodiment of the present technology.

FIG. 17 is a flowchart illustrating an example of the read process in the first embodiment. The memory controller 300 acquires the read address (step S921) and acquires the read data from the non-volatile memory 400 in accordance with the read request (step S922). Then, the memory controller 300 decodes the read data (ECC) using the parity (step S923).

The memory controller 300 determines whether or not the inversion bit in the decoded data is "0" (step S924). In a case in which the inversion bit is "0" (Yes in step S924), the memory controller 300 transmits the non-management information to the host computer 100 as the original data (step S925). On the other hand, in a case in which the inversion bit is "1" (No in step S924), the memory controller 300 inverts the non-management information (step S926) and transmits the inverted non-management information to the host computer 100 as the original data (step S927).

As described above, according to the first embodiment of the present technology, since the memory system estimates the voltage drop amount and inverts the original data in a case in which the estimation value exceeds the threshold value, the increase in the voltage drop amount can be suppressed.

First Modified Example

In the first embodiment described above, the memory controller 300 controls the cross point type non-volatile memory in which the wiring layer of the column line and the wiring layer of the row line are stacked, but the non-volatile memory to be controlled is not limited to the cross point type. For example, a vertical 3 dimension (V3D) type may be controlled. A non-volatile memory 400 of a first modified example in this first embodiment differs from the first embodiment in that the non-volatile memory to be controlled is a V3D type.

Figure 18:
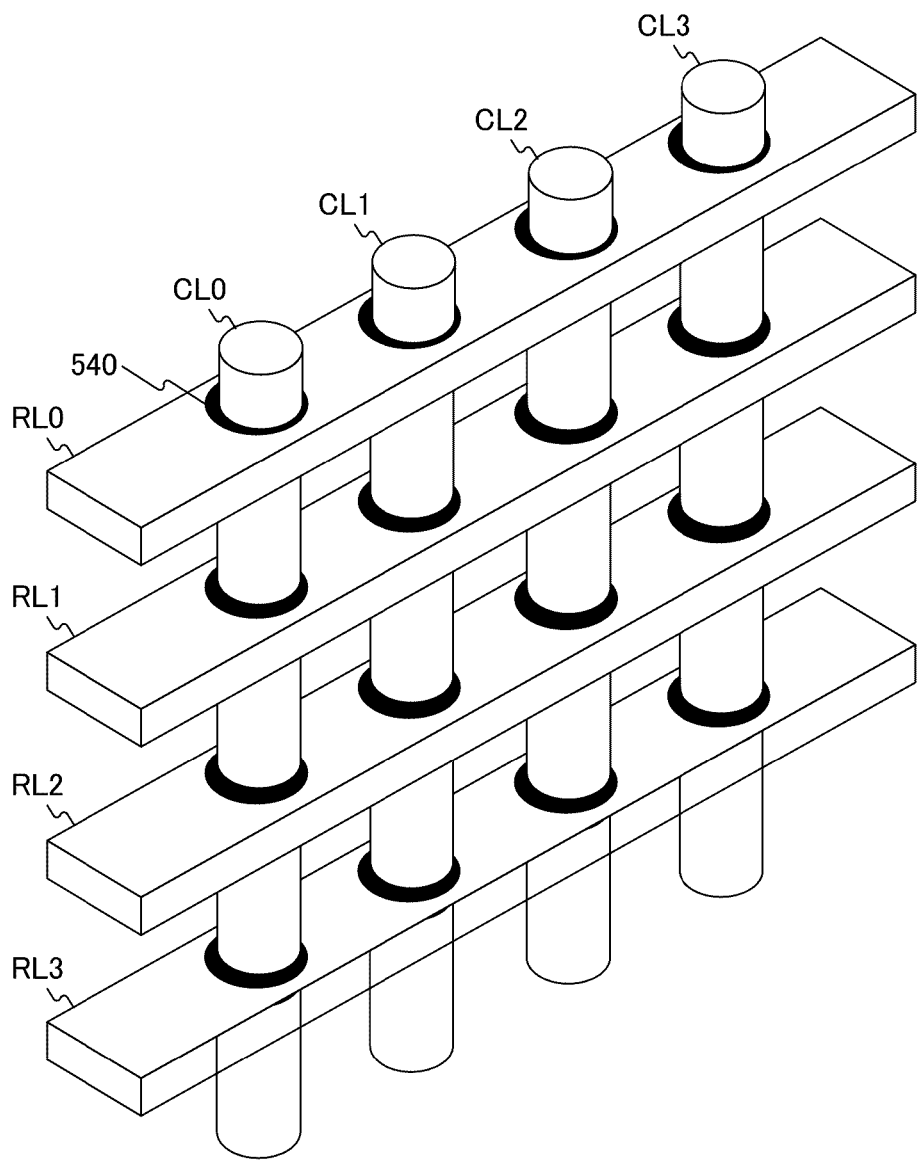
FIG. 18 is a perspective view of a memory cell array in a first modified example of the first embodiment of the present technology.

FIG. 18 is a perspective view of a memory cell array 530 in the first modified example of the first embodiment. The row line RLp stacked on a semiconductor substrate, and the column line CLq penetrates the row lines in a stack direction. Further, the memory cell 540 is formed at a position interposed between an inner surface of a through hole on the row line passing the column line and a side surface of the column line.

As described above, according to the first modified example of the first embodiment of the present technology, since the voltage drop amount when it is held in the V3D type non-volatile memory 400 is estimated, it is possible to suppress the increase in the voltage drop amount in the V3D type non-volatile memory 400.

Second Modified Example

In the first embodiment described above, the plurality of memory array units 500 share the data buffer 410 and the address decoder 430, but the data buffer 410 and the address decoder 430 may not be shared, and the data buffer 410 and the address decoder 430 may be disposed for each memory array unit. A non-volatile memory 400 of a second modified example in this first embodiment differs from the first embodiment in that a data buffer and an address decoder are disposed for each memory array unit.

Figure 19:
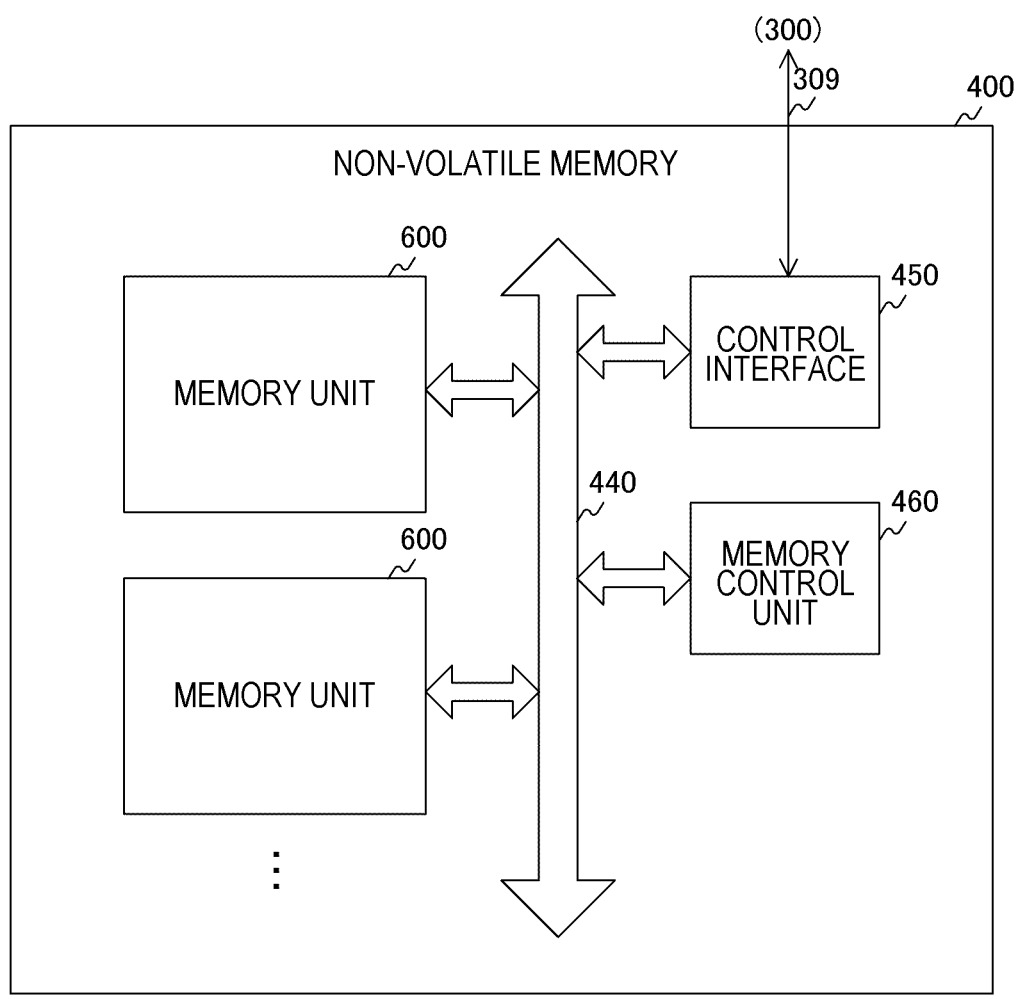
FIG. 19 is a block diagram illustrating a configuration example of a non-volatile memory in a second modified example of the first embodiment of the present technology.

FIG. 19 is a block diagram illustrating a configuration example of the non-volatile memory 400 in the second modified example of the first embodiment. A configuration of the non-volatile memory 400 of the second modified example differs from that of the first embodiment in that a plurality of memory units 600 are disposed instead of the MAU array unit 420, the data buffer 410 and the address decoder 430.

Figure 20:
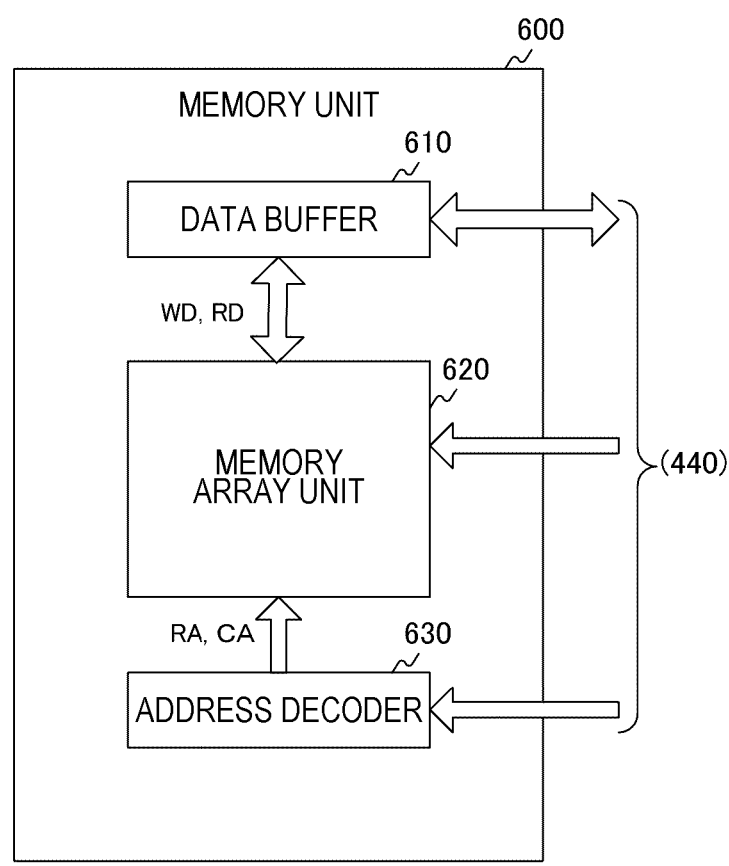
FIG. 20 is a block diagram illustrating a configuration example of a memory unit in the second modified example of the first embodiment of the present technology.

FIG. 20 is a block diagram illustrating a configuration example of a memory unit 600 in the second modified example of the first embodiment. The memory unit 600 includes a data buffer 610, a memory array unit 620, and an address decoder 630. Since the data buffer 610 and the address decoder 630 are disposed for each memory array unit 620, it is possible to execute data buffering and an address decoding process in parallel and improve the access speed.

As described above, in the non-volatile memory 400 of the second modified example in the first embodiment of the present technology, since the data buffer 610 and the address decoder 630 are disposed for each memory array unit 620, the access speed can be improved.

2. Second Embodiment

In the first embodiment described above, the memory controller 300 estimates the IR drop by multiplying by the weight coefficient $k_n$ for each bit in the original data, but as the number of bits of the original data increases, the computational amount increases. Since a circuit size, a calculation time, and power consumption of a circuit for performing the estimation increase as the computational amount increases, it is desirable to reduce the computational amount. A memory controller 300 of the second embodiment differs from that of the first embodiment in that the computational amount for estimating the IR drop is reduced.

Figure 21:
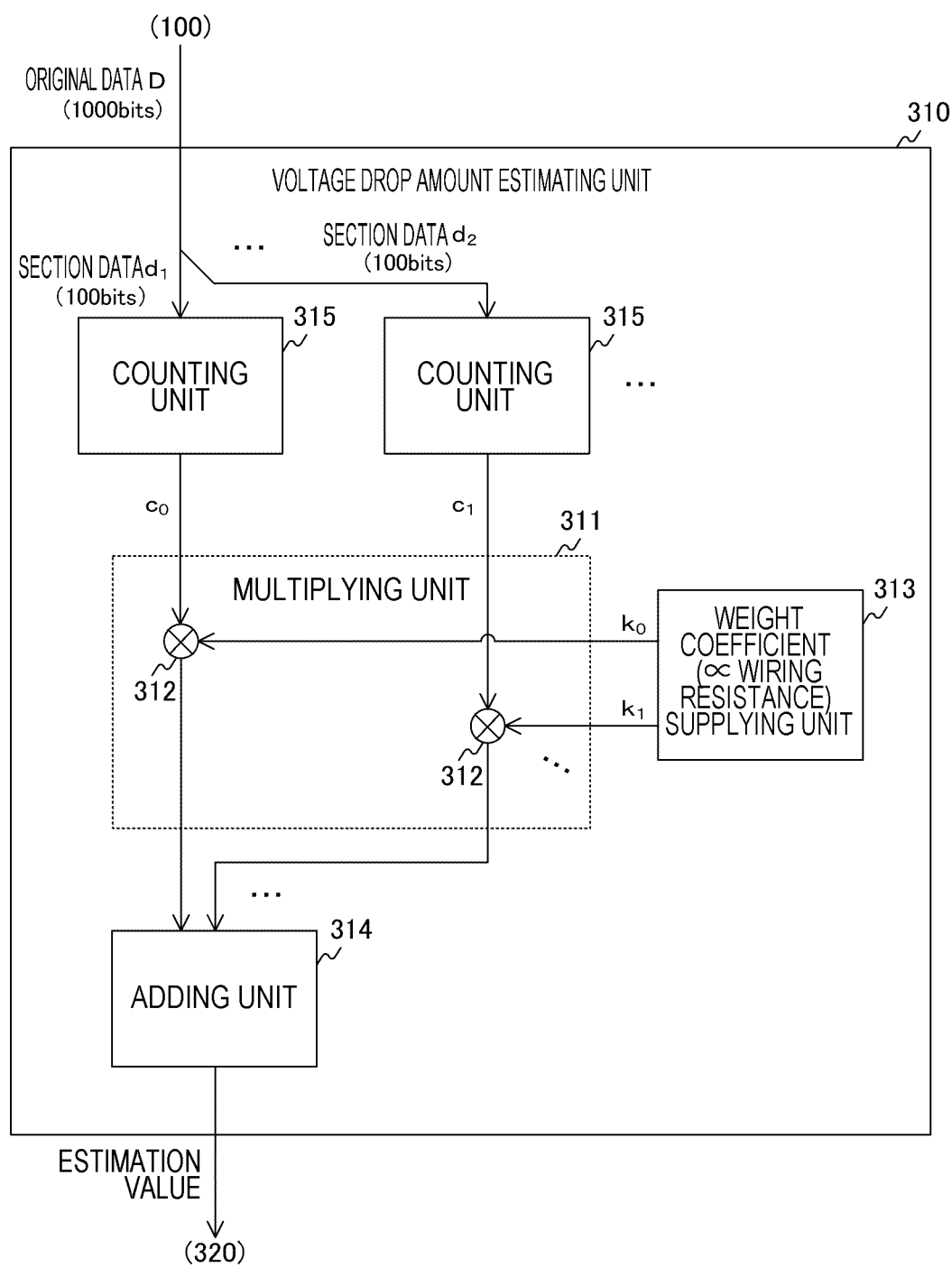
FIG. 21 is a block diagram illustrating a configuration example of a voltage drop amount estimating unit in a second embodiment of the present technology.

FIG. 21 is a block diagram illustrating a configuration example of a voltage drop amount estimating unit 310 in the second embodiment. The voltage drop amount estimating unit 310 of the second embodiment differs from the first embodiment in that a plurality of counting units 315 are further disposed.

In the second embodiment, the original data is divided into a plurality of pieces of section data and processed. For example, 1000-bit original data is divided into ten pieces of section data each including 100 bits.

The counting unit 315 counts the number of "1" bits in an i-th section data (i is an integer from 0 to 9). The counting unit 315 supplies a count value $c_i$ to the multiplying unit 311. The count value $c_i$ is a value corresponding to a sum of the leakage currents of the memory cells holding the section data.

The weight coefficient supplying unit 313 of the second embodiment supplies a weight coefficient $k_i$ corresponding to the representative value of the wiring resistance corresponding to each bit in the section data for each piece of section data. For example, a value corresponding to an average value or a median value of 100 wiring resistances corresponding to 100 bits in the section data is used as the weight coefficient of the section.

The multiplying unit 311 of the second embodiment multiplies the count value $c_i$ by the weight coefficient $k_i$. The adding unit 314 of the second embodiment adds the multiplication values and supplies an addition result to the comparing unit 320. The process in the voltage drop amount estimating unit 310 and the comparing unit 320 of the second embodiment is indicated by the following Formula.

[Math. 4]

$$Th < \sum_{i=0}^{10} c_i k_i \qquad \text{Formula 4}$$

As described above, the memory controller 300 of the second embodiment sets the weight coefficient for each piece of section data and performs the weighted addition, and thus as compared with the first embodiment in which the weight coefficient is set for each bit, and the weighted addition is performed, the computational amount can be reduced.

For example, in a case in which the memory controller 300 of the first embodiment performs the weighted addition of 1000 bits, the number of multiplications is 1000, and the number of additions is 999.

On the other hand, in a case in which the memory controller 300 of the second embodiment performs the weighted addition of 1000 bits, the number of additions of each of the ten counting units 315 is 99 because the section data has 100 bits. Further, the number of multiplications is 10 because there are 10 pieces of section data. Further, the number of additions of the adding unit 314 is 9. Therefore, the number of additions is 999 (=99×10+9), and the number of multiplications is 10.

As described above, the number of additions does not change, and the number of multiplications decreases from 1000 to 10, and thus the overall computational amount decreases.

As described above, according to the second embodiment of the present technology, since the memory controller 300 performs the weighted addition in accordance with the weight coefficient for each piece of section data and estimates the voltage drop amount, the computational amount can be reduced as compared with the weighted addition is performed in accordance with the weight coefficient of each bit.

3. Third Embodiment

In the first embodiment described above, the memory controller 300 estimated the voltage drop amount in view of the wiring distance of the row line in the original data. However, since the memory cell is also connected to the column line, it is possible to accurately estimate the voltage drop amount when the wiring distance of the column line is also taken into consideration. A memory controller 300 of the third embodiment differs from that of the first embodiment in that the memory controller 300 estimates the voltage drop amount on the basis of the wiring distances of both the column line and the row line.

Figure 22:
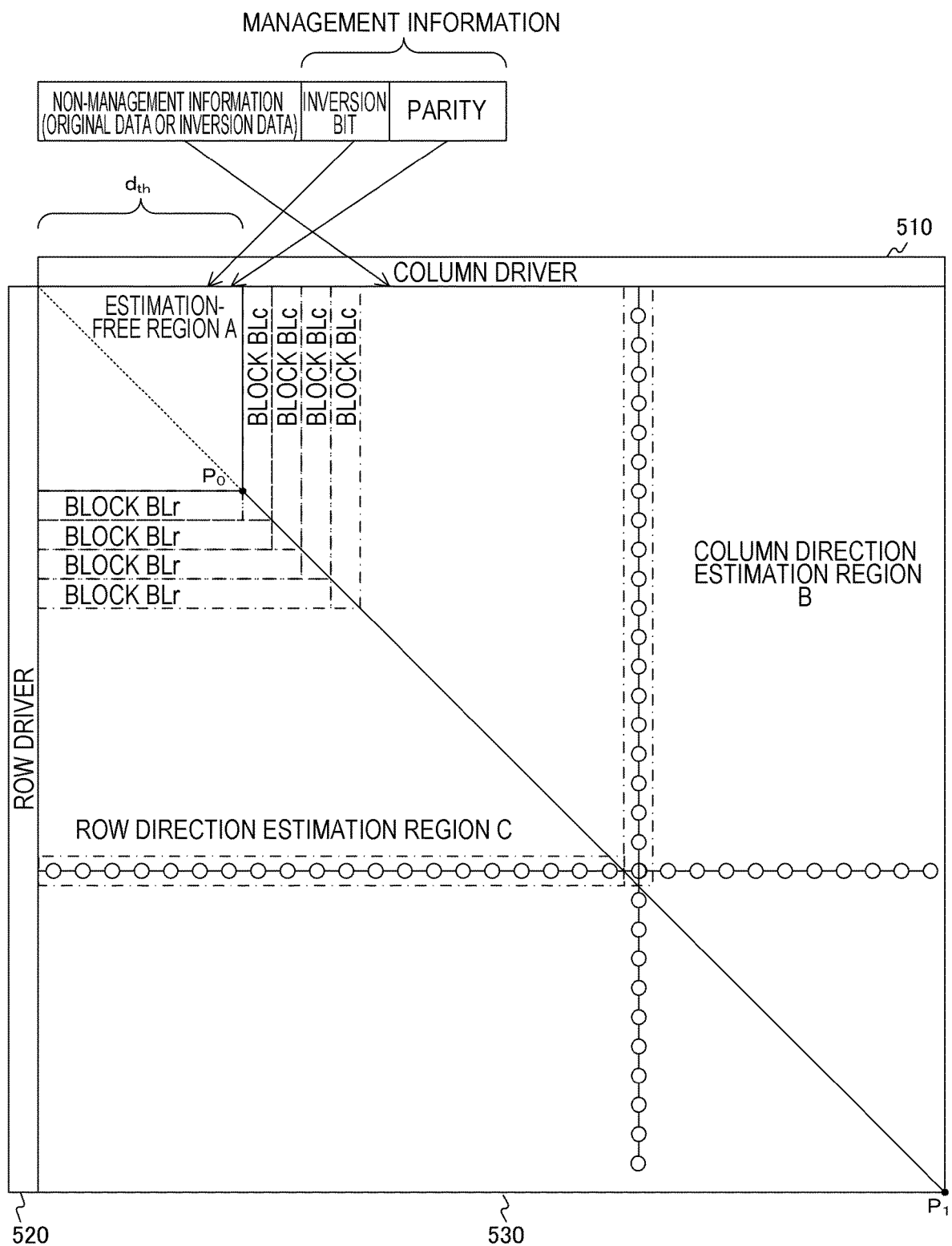
FIG. 22 is a diagram illustrating an example of a region in a memory cell array in a third embodiment of the present technology.

FIG. 22 is a diagram illustrating an example of regions in a memory cell array 530 in the third embodiment. The memory cell array 530 of the third embodiment is divided into an estimation-free region A, a column direction estimation region B, and a row direction estimation region C.

The estimation-free region A is a rectangular region in which a distance from a column driver 510 and a distance from a row driver 520 are equal to or less than a predetermined distance $d_{th}$. Since the wiring distance is equal to or less than the predetermined distance $d_{th}$, the voltage drop amount of the estimation-free region is smaller than that of the other regions (the column direction estimation region B and the row direction estimation region C), and it is less necessary to consider the voltage drop amount. For this reason, a voltage drop amount estimating unit 310 of the third embodiment does not estimate the voltage drop amount for the data written in the estimation-free region A.

It is desirable to keep the management information (the inversion bit and parity) in the estimation-free region A. This is because the management information is not inverted in accordance with the voltage drop amount, and the influence on the margin of the power voltage is not reduced. In an implementation, when the management information is written, the address converting unit 360 associates an address of the estimation-free region A among available physical addresses with a logical address. Further, a write destination of the management information is not limited to the estimation-free region A, and the memory controller 300 may write the management information in the column direction estimation region B or the row direction estimation region C. Further, the memory controller 300 may write the management information preferentially in the estimation-free region A and write the management information in the column direction estimation region B or the row direction estimation region C in a case in which the estimation-free region A is not available.

Further, the column direction estimation region B is a region adjacent to the column driver 510 out of two regions divided by a line segment connecting a point $P_0$ with a point $P_1$. Here, the point $P_0$ is a point at which the distances from both the column driver 510 and the row driver 520 are equal to the predetermined distance $d_{th}$. Further, the point $P_1$ is a point at which the distances from both the column driver 510 and the row driver 520 are maximum in the memory cell array 530.

On the other hand, the row direction estimation region C is a region adjacent to the row driver 520 out of the two regions divided by the line segment connecting the point $P_0$ with the point $P_1$.

It is desirable that the column direction estimation region B and row direction estimation region C holds the non-management information.

Further, in a region adjacent to the column driver 510 out of the two regions divided by a diagonal passing through the point $P_0$ and the point $P_1$, blocks $BL_c$ including the memory cells arranged in the column direction are arranged. Further, the block size of the block $BL_c$ increases as the distance from the row driver 520 increases.

On the other hand, in a region adjacent to the row driver 520 out of the two regions divided by the diagonal passing through the point $P_0$ and the point $P_1$, blocks $BL_r$ including the memory cells arranged in the row direction are arranged. Further, the block size of the block $BL_r$ increases as the distance from the column driver 510 increases.

As described above, since the sizes of the respective blocks are different from each other, if each individual block is used an access unit, the access units are not constant. In general, since there is a restriction to a numerical value which can be used as a code length depending on the type of ECC, if the access units are not constant, there is a possibility that the ECC is unable to be encoded. In this regard, the address converting unit 360 designates physical addresses of a plurality of blocks in combination so that a total block size is constant. For example, in a case in which 8 bits are used as the access unit, the address converting unit 360 designates an address of a block having a block size of 1 bit and an address of a block having a block size of 7 bits in combination Further, in the column direction estimation region B, the voltage drop amount is estimated in accordance with the weight coefficient corresponding to the wiring distance from the column driver 510. Further, the encoded data is written in blocks elongated in the column direction.

Further, in the row direction estimation region C, the voltage drop amount is estimated in accordance with the weight coefficient corresponding to the wiring distance from the row driver 520. Then, the encoded data is written in blocks elongated in the row direction.

Further, in a case in which the encoded data is written in the blocks elongated in the column direction, the row driver 520 acquires the write data from the data buffer 410 instead of the column driver 510. Further, the row driver 520 drives the row lines on the basis of the write data and the row address. On the other hand, in a case in which the encoded data is written in the blocks elongated in the row direction, the column driver 510 acquires the write data from the data buffer 410.

Further, the estimation-free region A may not be defined, and the memory cell array 530 may be divided into only the column direction estimation region B and the row direction estimation region C.

As described above, according to the third embodiment of the present technology, since the memory controller 300 performs the writing in units of blocks each including the memory cells arranged in the column direction in the column direction estimation region B, the increase in the voltage drop amount corresponding to the wiring distance of the column line can be suppressed.

4. Fourth Embodiment

In the first embodiment described above, only one row driver is disposed, but in the configuration, with the increase in the density of the non-volatile memory, the inter-line distance of the adjacent row lines is decreased, and an implementation is likely to be difficult. A memory array unit 500 in the fourth embodiment differs from that of the first embodiment in that the inter-line distance of the row lines is increased.

Figure 23:
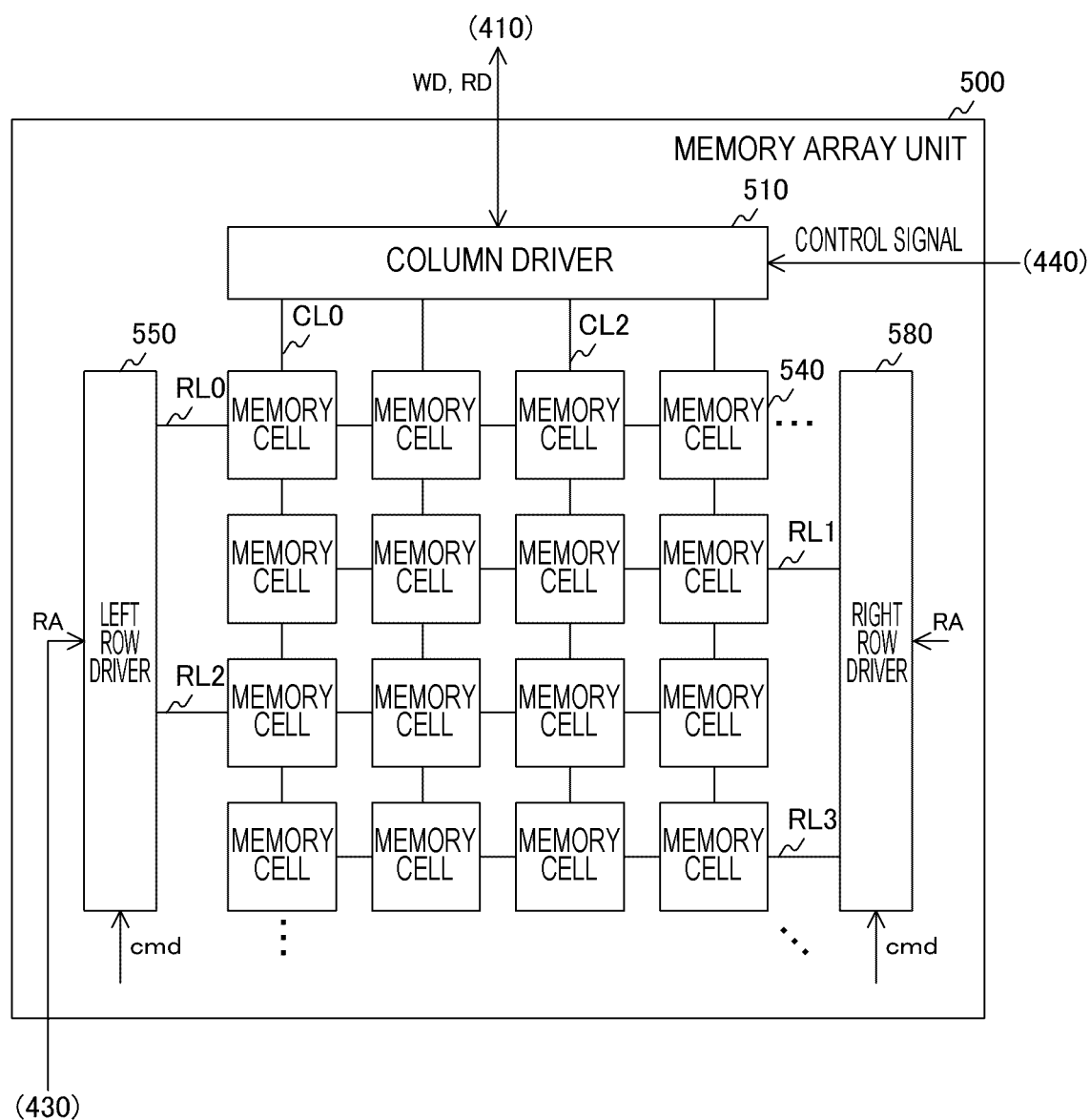
FIG. 23 is a block diagram illustrating a configuration example of a memory array unit in a fourth embodiment of the present technology.

FIG. 23 is a block diagram illustrating a configuration example of the memory array unit 500 in the fourth embodiment. The memory array unit 500 of the fourth embodiment differs from the first embodiment in that two row drivers are disposed. For example, instead of the row driver 520, a left row driver 550 and a right row driver 580 are disposed.

The left row driver 550 drives odd-numbered rows, and the right row driver 580 drives even-numbered rows. Since the two row drivers are disposed as described above, the number of columns per driver is reduced as compared with the case in which one row driver are disposed, and thus the inter-line distance between the column lines and the row lines can be increased. Accordingly, the density of the non-volatile memory can be increased. Alternatively, it becomes easy to implement.

Further, the left row driver 550 is an example of an odd-numbered row driver described in claims set forth below, and the right row driver 580 is an example of an even-numbered row driver described in claims set forth below.

Figure 24:
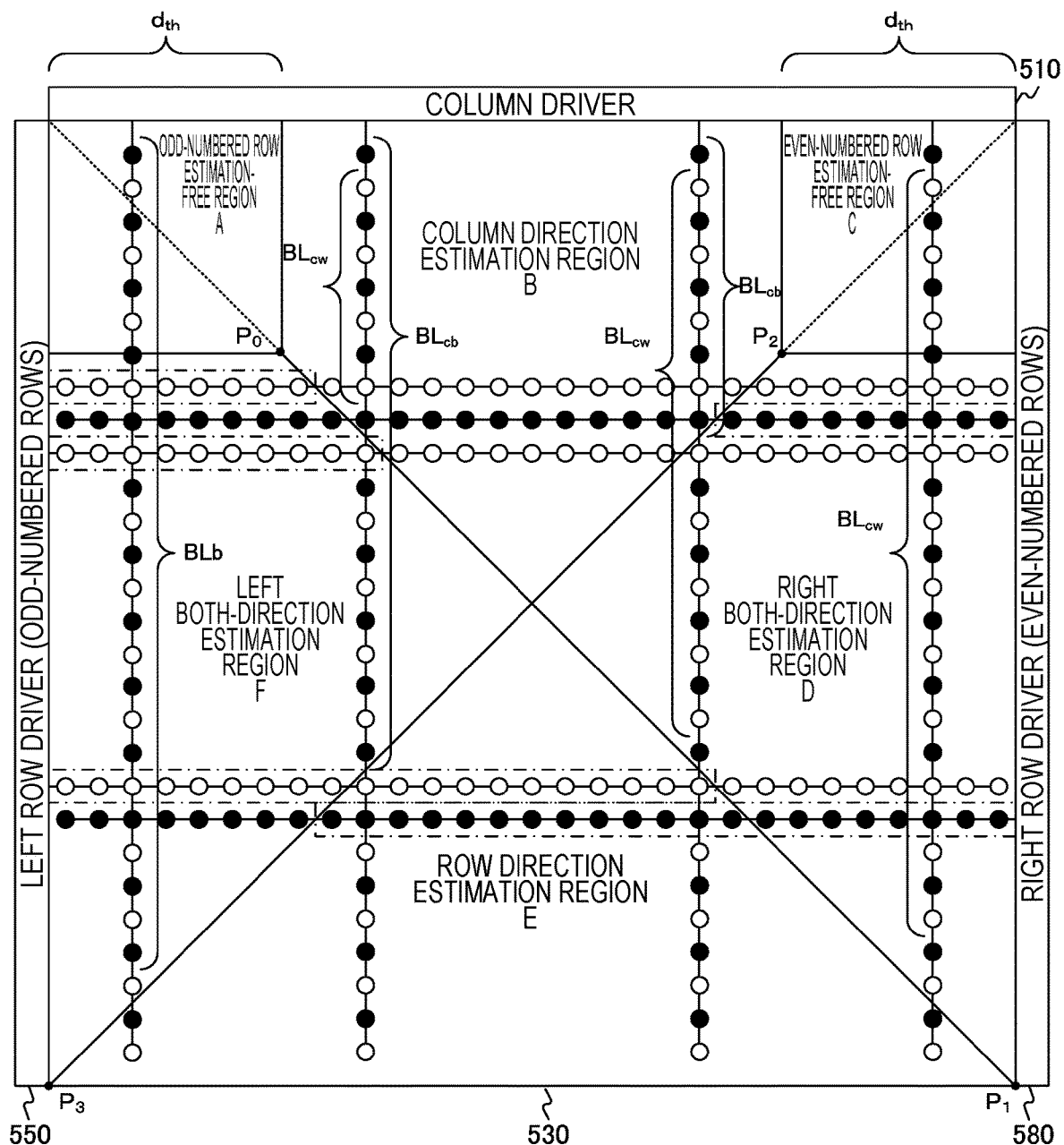
FIG. 24 is a diagram illustrating an example of a region in a memory cell array in the fourth embodiment of the present technology.

FIG. 24 is a diagram illustrating an example of regions in a memory cell array 530 in the fourth embodiment. The memory cell array 530 of the fourth embodiment includes an odd-numbered row estimation-free region A, a column direction estimation region B, an even-numbered row estimation-free region C, a right both-direction estimation region D, a row direction estimation region E, and a left both-direction estimation region F.

The odd-numbered row estimation-free region A is a rectangular region in which a wiring distance from a column driver 510 and a wiring distance from a left row driver 550 are equal to or less than a predetermined distance $d_{th}$. Since the wiring distance of the odd-numbered row connected to the left row driver 550 is equal to or less than the predetermined distance $d_{th}$, the voltage drop amount of the odd-numbered row is relatively small, and it is less necessary to consider the voltage drop amount. Therefore, the voltage drop amount estimating unit 310 of the fourth embodiment does not estimate the voltage drop amount for the data written in the odd-numbered row in the odd-numbered row estimation-free region A. On the other hand, for the even-numbered row in the odd-numbered row estimation-free region A, the voltage drop amount is estimated in accordance with the weight coefficient corresponding to the wiring distance from a right row driver 580.

The even-numbered row estimation-free region C is a rectangular region in which the wiring distance from the column driver 510 and the wiring distance from the right row driver 580 are equal to or less than the predetermined distance $d_{th}$. Since the wiring distance of the even-numbered row connected to the right row driver 580 is equal to or less than the predetermined distance $d_{th}$, the voltage drop amount of the even-numbered row is relatively small, and it is less necessary to consider the voltage drop amount. For the reason, the voltage drop amount estimating unit 310 of the fourth embodiment does not estimate the voltage drop amount for the data written in the even-numbered row in the even-numbered row estimation-free region C. On the other hand, for the odd-numbered row in the even-numbered row estimation-free region C, the voltage drop amount is estimated in accordance with the weight coefficient corresponding to the wiring distance from the left row driver 550.

It is desirable to hold the management information in the odd-numbered row in the odd-numbered row estimation-free region A and the even-numbered row in the even-numbered row estimation-free region C. It is desirable to hold the non-management information in the other regions.

Further, the regions other than the odd-numbered row estimation-free region A and the even-numbered row estimation-free region C are divided into four by a line segment connecting a point $P_0$ with a point $P_1$ and a line segment connecting a point $P_2$ with a point $P_3$. Here, the point $P_0$ is a point at which the distances from both the column driver 510 and the left row driver 550 are equal to the predetermined distance $d_{th}$. Further, the point $P_1$ is a point at which the distances from both the column driver 510 and the left row driver 550 are maximum in the memory cell array 530. The point $P_2$ is a point at which the distances from both the column driver 510 and the right row driver 580 are equal to the predetermined distance $d_{th}$. Further, the point $P_3$ is a point at which the distances from both the column driver 510 and the right row driver 580 are maximum in the memory cell array 530.

A region adjacent to the column driver 510 among the four regions is the column direction estimation region B, and the region adjacent to the right row driver 580 is the right both-direction estimation region D. Further, a region adjacent to the left row driver 550 among the four regions is the left both-direction estimation region F, and the remaining region is the row direction estimation region E.

Further, a case in which the memory cell array 530 is divided into two by a diagonal passing through the points $P_0$ and $P_1$. In the odd-numbered row in the region adjacent to the left row driver 550 among these regions, blocks $BL_{rw}$ including the memory cells arranged in the row direction are arranged. In FIG. 24, portions defined by white circles surrounded by an alternate long and short dash line indicates the block $sBL_{rw}$ in the odd-numbered row. The block size of block $BL_{rw}$ increases as the distance from the column driver 510 increases.

Next, a case in which the memory cell array 530 is divided into two by a diagonal passing through the points $P_2$ and $P_3$. In the even-numbered rows in the region adjacent to the right row driver 580 among these regions, blocks $BL_{rb}$ including the memory cells arranged in the row direction are arranged. In FIG. 24, portions defined by black circles surrounded by an alternate long and short dashed line indicate the blocks $BL_{rb}$ in the even-numbered row. The block size of block $BL_{rb}$ increases as the distance from the column driver 510 increases.

Further, in a region adjacent to the column driver 510 among regions divided by the diagonal passing through the points $P_0$ and $P_1$, blocks $BL_{cw}$ including the memory cells at the positions of the white circles arranged in the column direction are arranged. The block size of block $BL_{cw}$ increases as the distance from the left row driver 550 increases.

On the other hand, in a region adjacent to the column driver 510 among the regions divided by the diagonal passing through points $P_2$ and $P_3$, blocks $BL_{cb}$ including the memory cells at the positions of the black circles arranged in the column direction are arranged. The block size of block $BL_{cb}$ increases as the distance from the right row driver 580 increases.

As described above, since the sizes of the blocks are different, similarly to the third embodiment, the physical addresses of a plurality of blocks are designated so that the access units are constant.

Further, for the even-numbered rows (the black circles) in the left both-direction estimation region F, the column direction estimation region B, and the odd-numbered row (the white circles) in the right both-direction estimation region D, the voltage drop amount is estimated in accordance with the weight coefficient corresponding to the wiring distance from the column driver 510. Further, the encoded data is written in the blocks elongated in the column direction.

Further, for the odd-numbered rows (the white circles) in the left both-direction estimation region F and the row direction estimation region E, the voltage drop amount is estimated in accordance with the weight coefficient corresponding to the wiring distance from the left row driver 550. For the even-numbered rows (the black circles) in the right both-direction estimation region D and the row direction estimation region E, the voltage drop amount is estimated in accordance with the weight coefficient corresponding to the wiring distance from the right row driver 580. Then, the encoded data is written to the blocks elongated in the row direction.

As described above, according to the fourth embodiment of the present technology, since the two row drivers are disposed, the inter-line distance of the row line can be increased as compared with a case in which only one row driver is disposed.

5. Fifth Embodiment

In the fourth embodiment described above, one column driver is disposed, but in this configuration, an inter-line distance between adjacent column lines is reduced with the increase in the density of non-volatile memories, and thus it may be difficult to implement. A memory array unit 500 of the fifth embodiment differs from the first embodiment in that the inter-line distance between the column lines is increased.

Figure 25:
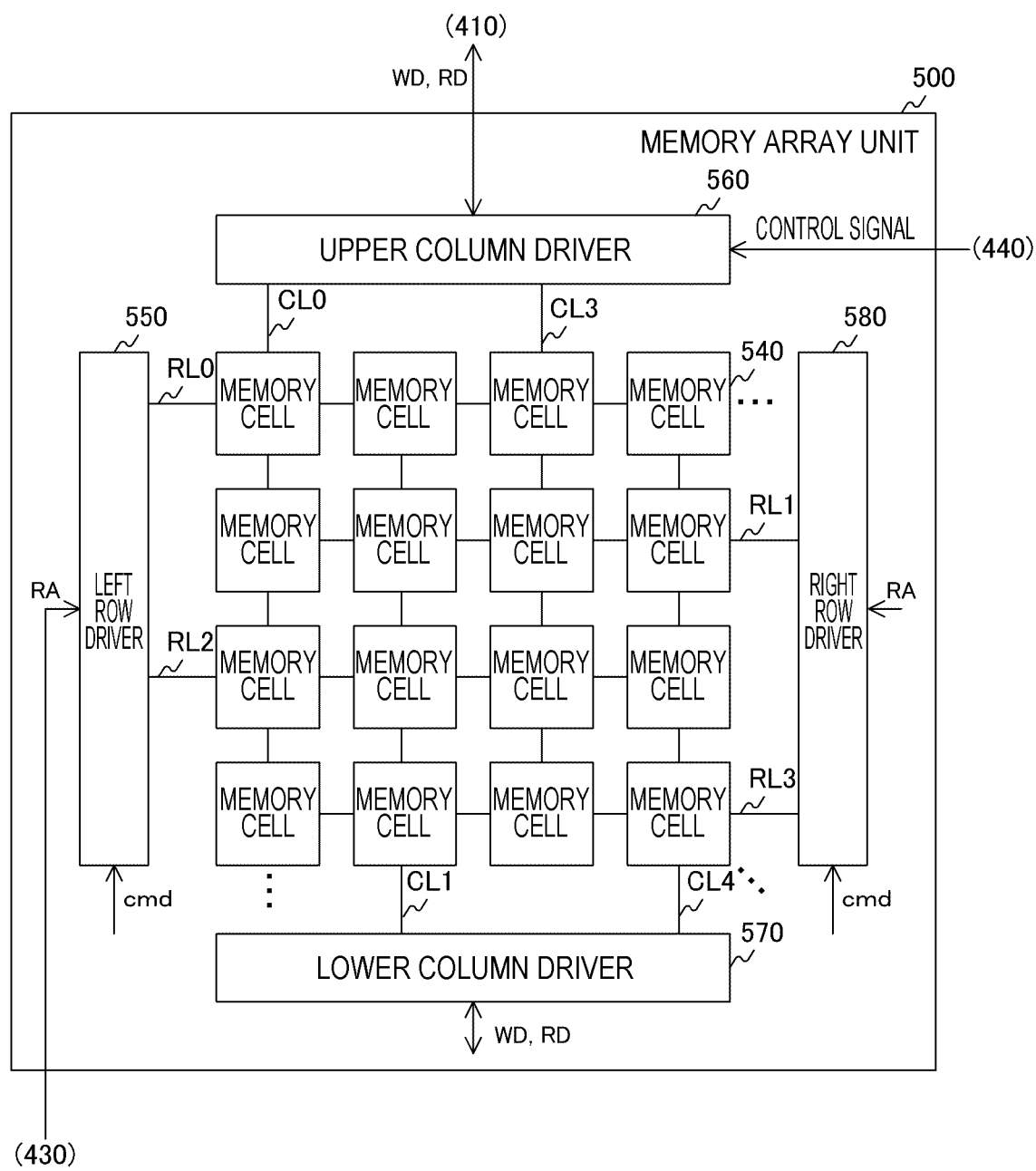
FIG. 25 is a block diagram illustrating a configuration example of a memory array unit in a fifth embodiment of the present technology.

FIG. 25 is a block diagram illustrating a configuration example of the memory array unit 500 in the fifth embodiment. The memory array unit 500 of the fifth embodiment differs from the fourth embodiment in that two column drivers are disposed. For example, instead of the column driver 510, an upper column driver 560 and a lower column driver 570 are disposed.

The upper column driver 560 drives the odd-numbered columns, and the lower column driver 570 drives the even-numbered columns. Since the two column drivers are disposed as described above, the number of rows per driver is reduced as compared with a case in which only one column driver is disposed, the inter-line distance of each column line can be increased. Accordingly, the density of the nonvolatile memory can be increased. Alternatively, it is easy to implement.

Further, the upper column driver 560 is an example of an odd-numbered column driver described in claims set forth below, and the lower column driver 570 is an example of an even-numbered column driver described in claims set forth below.

Further, the two column drivers and the two row drivers are disposed, a configuration in which two column drivers and one row drivers are disposed may be employed.

Figure 26:
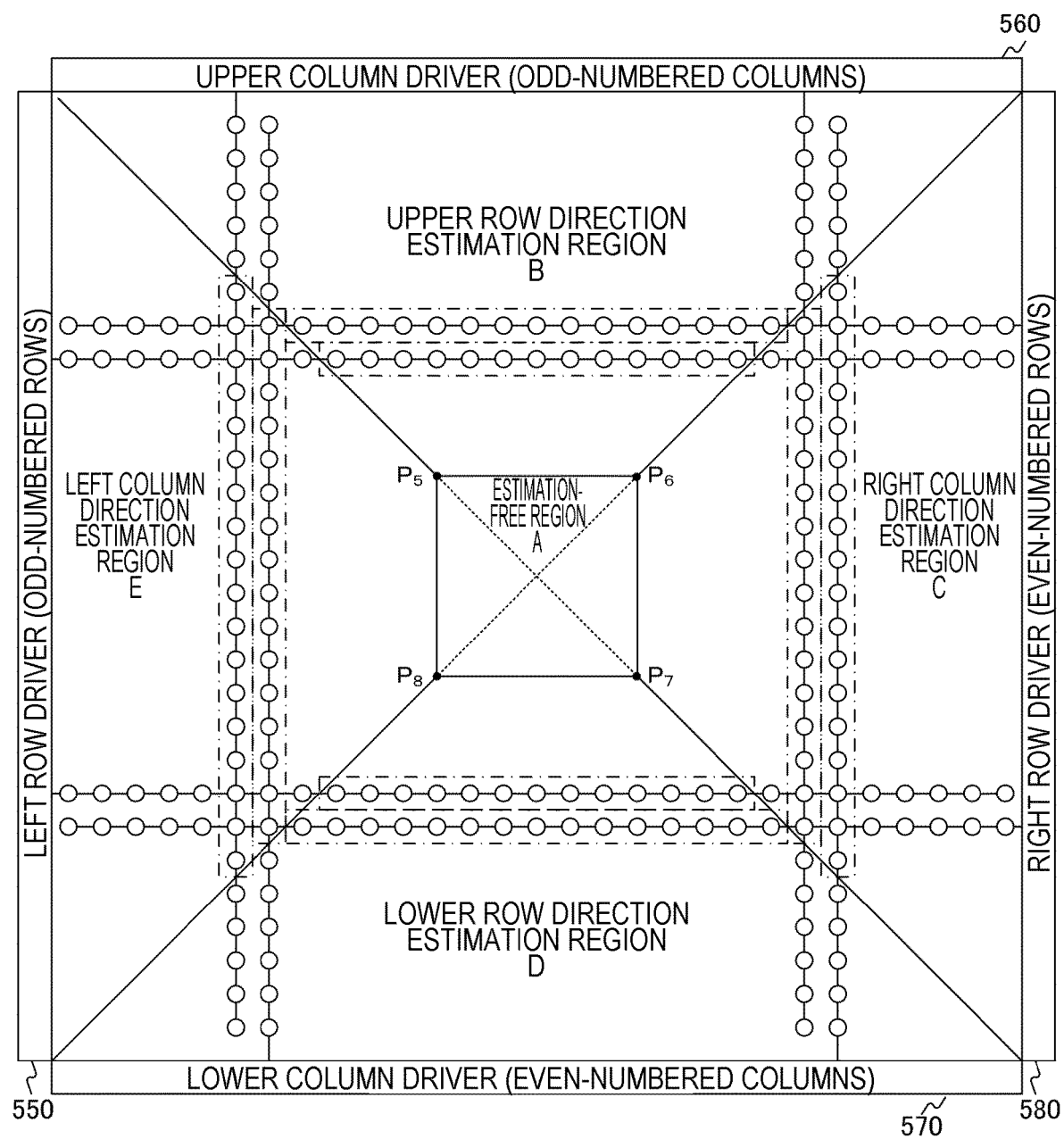
FIG. 26 is a diagram illustrating an example of a region in a memory cell array in the fifth embodiment of the present technology.

FIG. 26 is a diagram illustrating an example of regions in a memory cell array 530 in the fifth embodiment. The memory cell array 530 of the fifth embodiment is divided into an estimation-free region A, an upper row direction estimation region B, a right column direction estimation region C, a lower row direction estimation region D, and a left column direction estimation region E.

The estimation-free region A is a rectangular region having points $P_5$, $P_6$, $P_7$ and $P_8$ as vertexes. Here, the point $P_5$ is a point at which the distances from the upper column driver 560 and the left row driver 550 are equal to the predetermined distance $d_{th}$. The point $P_6$ is a point at which the distances from the upper column driver 560 and the right row driver 580 are equal to the predetermined distance $d_{th}$. The point $P_7$ is a point at which the distances from the lower column driver 570 and the right row driver 580 are equal to the predetermined distance $d_{th}$. The point $P_8$ is a point at which the distances from the lower column driver 570 and the left row driver 550 are equal to the predetermined distance $d_{th}$.

The regions other than the estimation-free region A are divided into four by a diagonal passing through the points $P_5$ and $P_7$ and a diagonal points passing through the points $P_6$ and $P_8$. A region adjacent to the upper column driver 560 among the four regions is the upper row direction estimation region B, and a region adjacent to the right row driver 580 is the right column direction estimation region C. Further, a region adjacent to the lower column driver 570 among the four regions is the lower row direction estimation region D, and a region adjacent to the left row driver 550 is the left column direction estimation region E.

It is desirable to hold the management information in the estimation-free region A. It is desirable to hold the non-management information in the other regions.

Further, a case in which the memory cell array 530 is divided into four by two symmetrical diagonals is considered. In a region adjacent to the upper column driver 560 among the four regions, blocks including the memory cells arranged in the row direction are arranged. The block size of the block increases as the distance from the lower column driver 570 increases. Further, in a region adjacent to the lower column driver 570 among the four regions, blocks including the memory cells arranged in the row direction are arranged. The block size of the block increases as the distance from the upper column driver 560 increases.

In a region adjacent to the right row driver 580 among the four regions divided by the two symmetrical diagonal blocks, blocks including the memory cells arrayed in the column direction are arranged. The block size of the block increases as the distance from the left row driver 550 increases. Further, in a region adjacent to the left row driver 550 among the four regions, blocks including the memory cells arranged in the column direction are arranged. The block size of the block increases as the distance from the right row driver 580 increase.

As described above, since the sizes of the blocks are different, similarly to the third embodiment, the physical addresses of a plurality of blocks are designated so that the access units are constant.

In the estimation-free region A, the voltage drop amount is not estimated, and the inversion encoding is not performed. Further, in the odd-numbered rows in the upper row direction estimation region B and lower row direction estimation region D, the voltage drop amount is estimated in accordance with the weight coefficient corresponding to the wiring distance from the left row driver 550. On the other hand, in the even-numbered rows in the upper row direction estimation region B and the lower row direction estimation region D, the voltage drop amount is estimated in accordance with the weight coefficient corresponding to the wiring distance from the right row driver 580. Further, the encoded data is written to the blocks elongated in the row direction.

In the odd-numbered columns in the right column direction estimation region C and the left column direction estimation region E, the voltage drop amount is estimated in accordance with the weight coefficient corresponding to the wiring distance from the upper column driver 560. On the other hand, in the even-numbered columns in these regions, the voltage drop amount is estimated in accordance with the weight coefficient corresponding to the wiring distance from the lower column driver 570. Then, the encoded data is written in the blocks elongated in the column direction.

As described above, according to the fifth embodiment of the present technology, since the two column drivers are disposed, it is possible to increase the inter-line distance of the column line as compared with the case in which only one column driver is disposed.

6. Sixth Embodiment

In the first embodiment described above, the ECC encoding is performed after the voltage drop amount is estimated, and then the inversion encoding is performed. However, since the parity in the ECC encoding is generated after the voltage drop amount is estimated, there is a problem in that the inversion encoding for suppressing the increase in the voltage drop amount is not performed. It is desirable to estimate the voltage drop amount and perform the inversion encoding for the parity. A memory system of the sixth embodiment differs from that of the first embodiment in that the inversion encoding is also performed for the parity.

Figure 27:
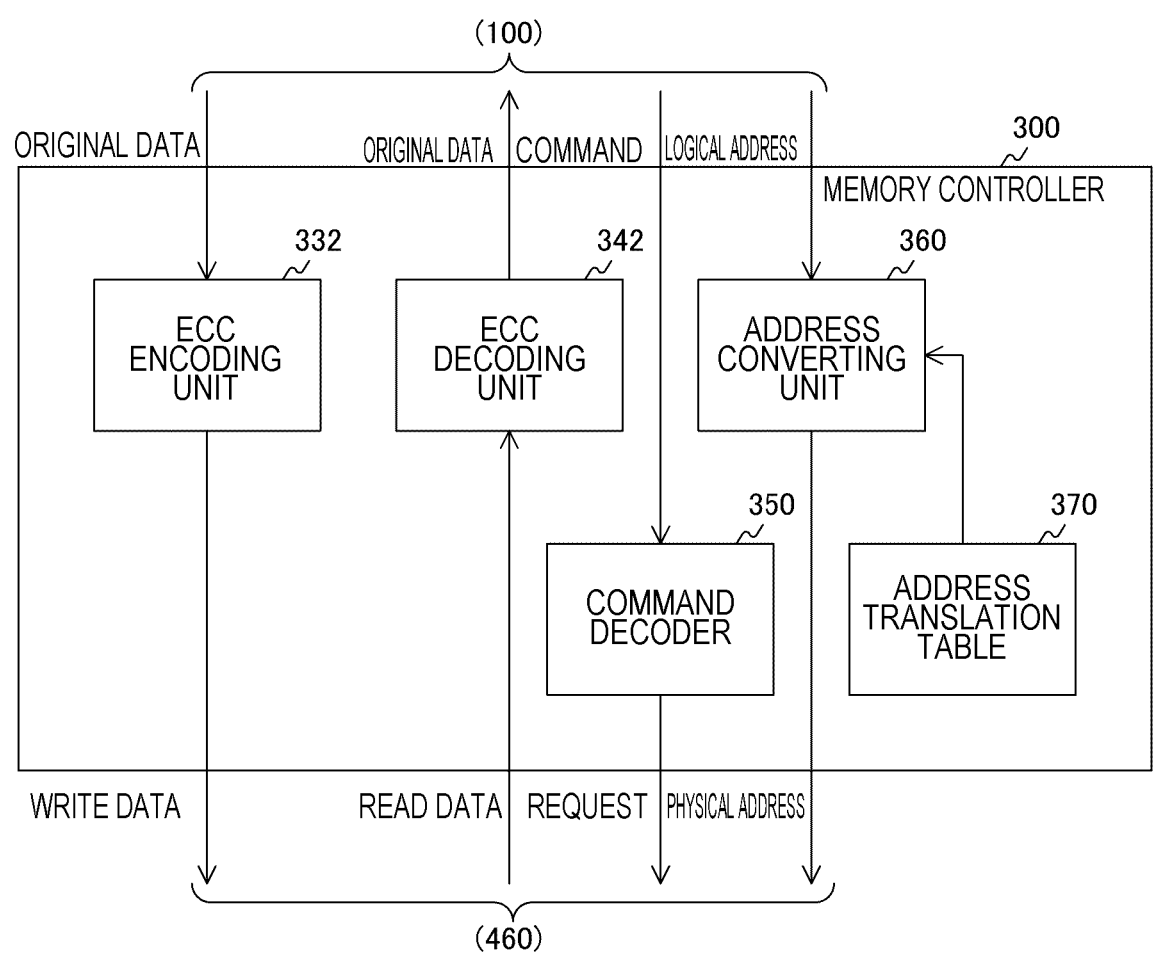
FIG. 27 is a block diagram illustrating an example of a functional configuration of the memory controller according to a sixth embodiment of the present technology.

FIG. 27 is a block diagram illustrating a functional configuration example of a memory controller 300 in the sixth embodiment. The memory controller 300 of the sixth embodiment differs from that of the first embodiment in that the voltage drop amount estimating unit 310, the comparing unit 320, the write side inverting unit 331, and the read side inverting unit 341 are not disposed. The memory controller 300 performs the ECC encoding without inverting the original data and supplies the encoding result to the nonvolatile memory 400.

Figure 28:
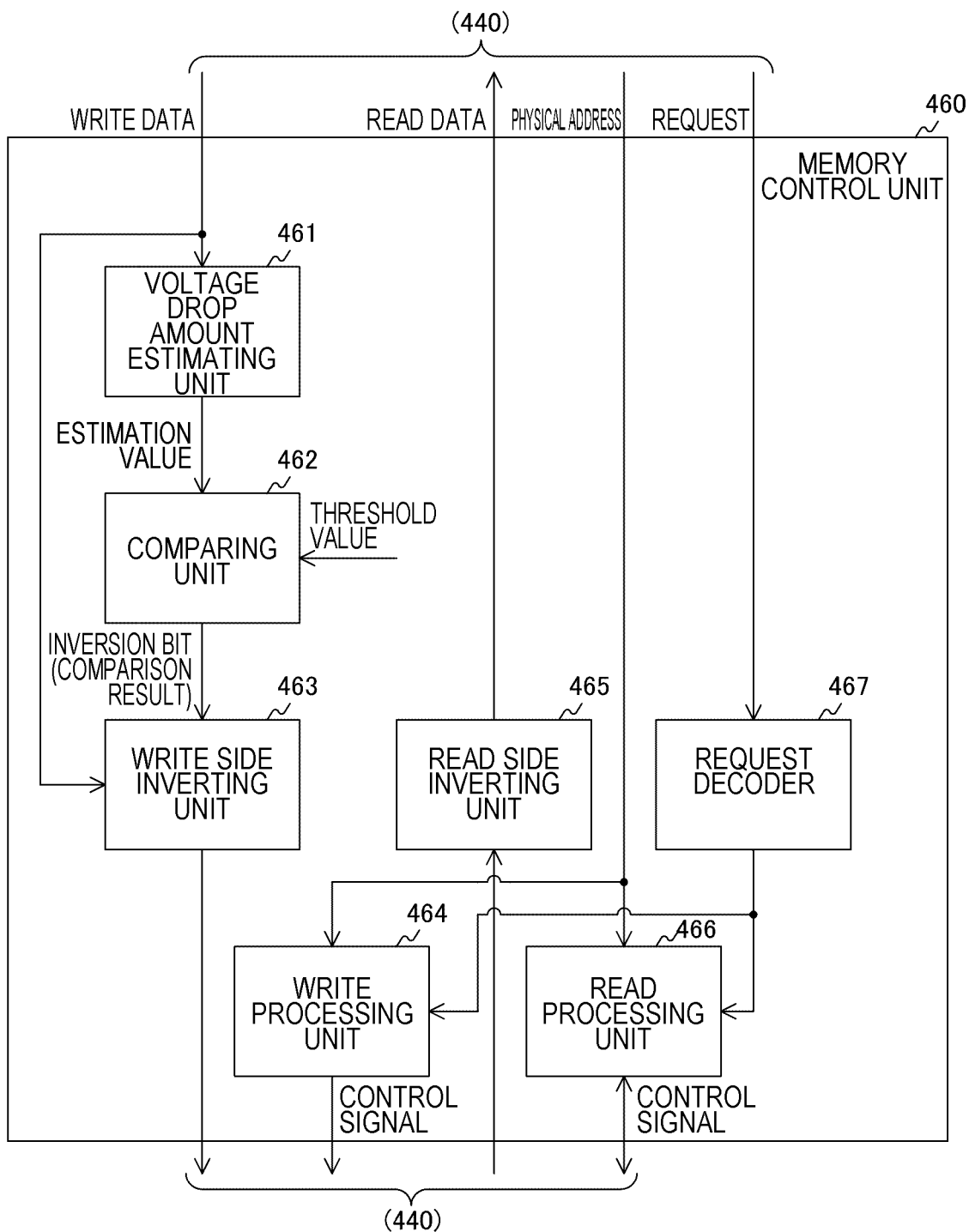
FIG. 28 is a block diagram illustrating a configuration example of a memory control unit in the sixth embodiment of the present technology.

FIG. 28 is a block diagram illustrating a configuration example of a memory control unit 460 in the sixth embodiment. The memory control unit 460 includes a voltage drop amount estimating unit 461, a comparing unit 462, a write side inverting unit 463, a write processing unit 464, a read side inverting unit 465, a read processing unit 466, and a request decoder 467.

The request decoder 467 decodes a request. The request decoder 467 supplies a decoding result to the write processing unit 464 and the read processing unit 466.

The configurations of the voltage drop amount estimating unit 461, the comparing unit 462, the write side inverting unit 463, and the read side inverting unit 465 are similar to the configurations of the voltage drop amount estimating unit 310, the comparing unit 320, the write side inverting unit 331, and the read side inverting unit 341 of the first embodiment. The write side inverting unit 463 performs the inversion encoding on the ECC-encoded write data and supplies the encoding result to a bus 440.

The write processing unit 464 writes data which has undergone the inversion encoding at a write address in accordance with a control signal (a set signal or a reset signal). The read processing unit 466 reads the read data from the write address in accordance with the control signal (the sense signal).

Further, in the sixth embodiment, the configurations of the second to fifth embodiments described above can be applied. In particular, in a case in which the third to fifth embodiments in which the estimation-free region in which the estimation of the voltage drop amount is not performed is set are applied, it is desirable to write the inversion bit in the estimation-free region and write data other than the inversion bit in the remaining region. Further, in the sixth embodiment, the non-volatile memory 400 performs the inversion encoding, but the memory controller 300 may further perform the inversion encoding after the ECC encoding.

As described above, according to the sixth embodiment of the present technology, since the memory system performs the inversion encoding after the ECC encoding, it is possible to also estimate the voltage drop amount for the parity can and perform the encoding.

7. Seventh Embodiment

In the first embodiment described above, the original data is inverted so that the voltage drop amount does not exceed the threshold value, but encoding other than the inversion encoding may be performed as long as it is possible to suppress the voltage drop amount to be equal to or less than a threshold value. For example, encoding of interchanging an order may be performed in units of bits. The memory controller 300 of the seventh embodiment differs from that of the first embodiment in that the encoding of interchanging the order is performed in units of bits instead of the inversion encoding.

Figure 29:
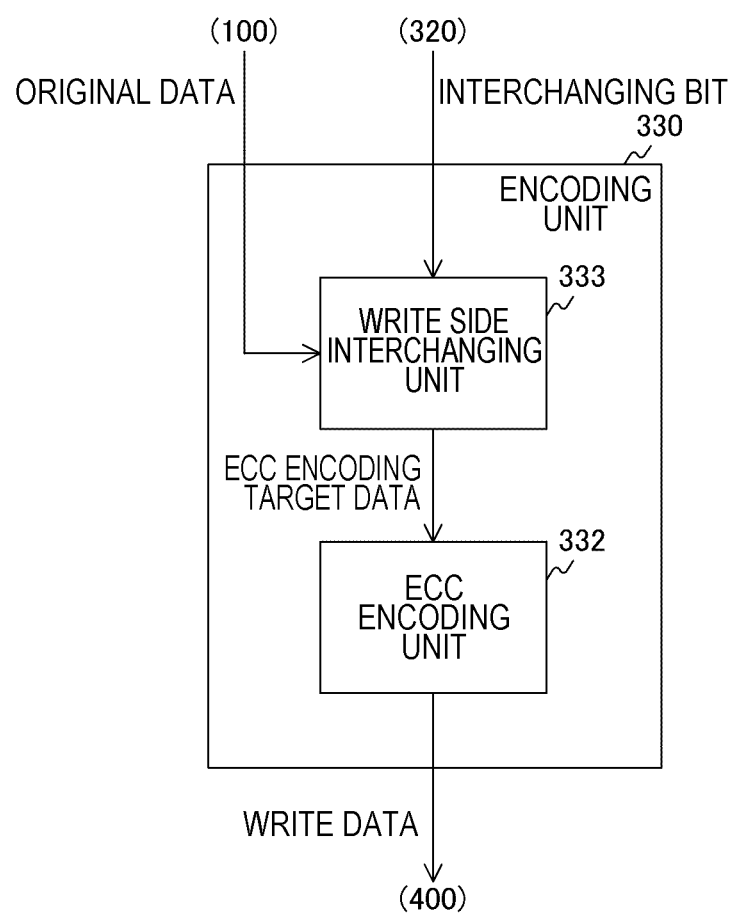
FIG. 29 is a block diagram illustrating a configuration example of an encoding unit in a seventh embodiment of the present technology.

FIG. 29 is a block diagram illustrating a configuration example of the encoding unit 330 in the seventh embodiment. The encoding unit 330 of the seventh embodiment differs from that of the first embodiment in that a write side interchanging unit 333 is disposed instead of the write side inverting unit 331.

The write side interchanging unit 333 performs a process of interchanging the order in units of bits in the original data as interchanging encoding. The write side interchanging unit 333 receives a comparison result from the comparing unit 320 as an interchanging bit. In a case in which the interchanging bit is "1," the write side interchanging unit 333 performs a process for interchanging an n-th bit of the original data with a 7-th bit. The write side interchanging unit 333 supplies the interchanged data to the non-volatile memory 400 as interchanging data together with the interchanging bit.

On the other hand, in a case in which the interchanging bit is "0," the write side interchanging unit 333 supplies the original data to the non-volatile memory 400 together with the interchanging bit.

Figure 30:
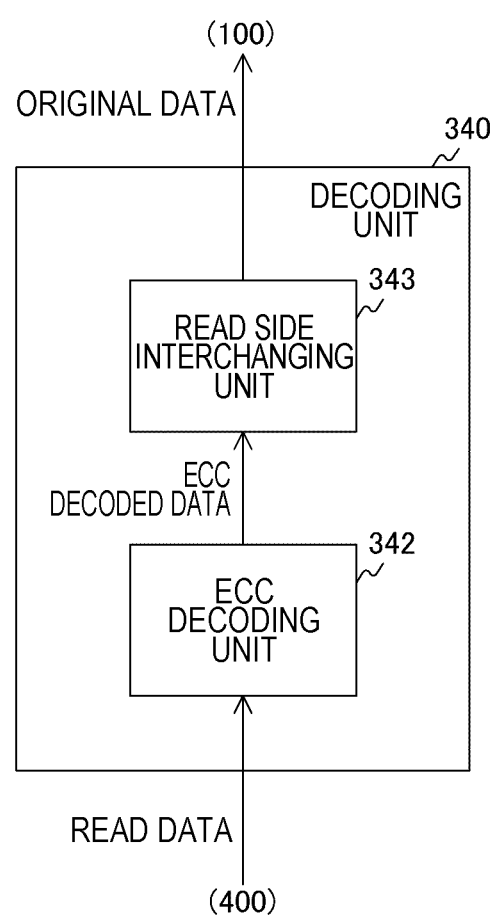
FIG. 30 is a block diagram illustrating a configuration example of a decoding unit in the seventh embodiment of the present technology.

FIG. 30 is a block diagram illustrating a configuration example of the decoding unit 340 in the seventh embodiment. The decoding unit 340 of the seventh embodiment differs from that of the first embodiment in that a read side interchanging unit 343 is disposed instead of the read side inverting unit 341. A configuration of the read side interchanging unit 343 is similar to that of the write side interchanging unit 333.

FIGS. 31A, 31B, 31C, and 13D are diagrams illustrating an example of data before and after encoding in the seventh embodiment. FIG. 31A is a diagram illustrating an example of the original data, and FIG. 31B is a diagram illustrating an example of the interchanging data. Further, FIG. 31C is a diagram illustrating an example of the ECC encoded target data, and FIG. 31D is a diagram illustrating an example of the write data.

First, the memory controller 300 estimates the IR drop when the original data is held in the memory cell without being inverted. If the original data is "00000111" of a binary number, the IR drop is estimated to be 21 $I_{LEAK}R_0$.

In a case in which the estimation value of the IR drop exceeds a threshold value, the memory controller 300 performs the interchanging encoding and generates the interchanging data "11100000" as illustrated in FIG. 13B. The IR drop of the inversion data is estimated to be 6 ILEAKR0 from Formula 1. As described above, due to the inversion, the IR drop decreases as compared with that before the inversion.

Then, as illustrated in FIG. 13C, the memory controller 300 uses the interchanging bit in which "1" is set and interchanging data (the non-management information) as the ECC encoded target data, and generates the parity as illustrated in FIG. 13D.

As described above, according to the seventh embodiment of the present technology, the memory system estimates the voltage drop amount and interchanges the order of the bits in the original data in a case in which the estimation value exceeds the threshold value, and thus the increase in the voltage drop amount can be suppressed.

8. Eighth Embodiment

In the first embodiment described above, the binary memory cell is disposed as the non-volatile memory 400, but a multi-value memory cell may be disposed. A memory system of the fifth embodiment differs from that of the first embodiment in that a multi-value memory cell is disposed.

Figure 32:
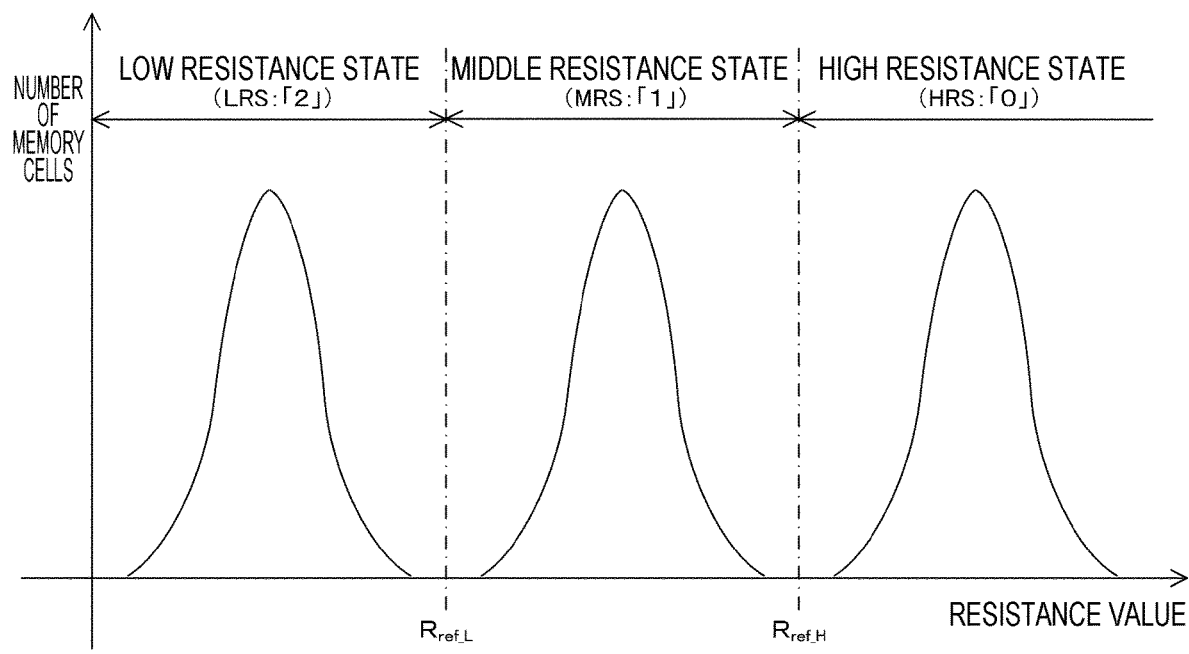
FIG. 32 is a diagram illustrating an example of a resistance distribution of a variable resistive element in an eighth embodiment of the present technology.

FIG. 32 is a diagram illustrating an example of a resistance distribution of a variable resistive element 542 in the eighth embodiment. In FIG. 32, a vertical axis indicates the number of cells of the memory cell 540, and a horizontal axis indicates the resistance value. In the memory cell 540, the resistance distribution is divided into three by two threshold value $R_{ref\_L}$ and $R_{ref\_H}$. A state of the resistance value between the LRS and the HRS is referred to as a middle-resistance state (MRS). For example, "2" is allocated to the LRS, "1" is allocated to the MRS, and "0" is allocated to the HRS.

Figure 33:
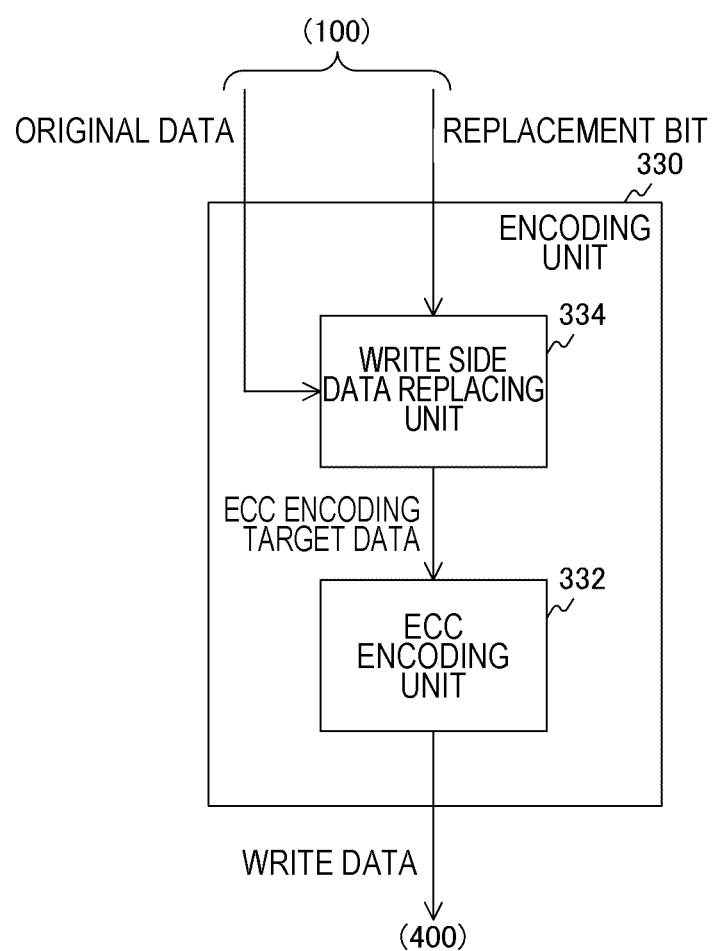
FIG. 33 is a block diagram illustrating a configuration example of an encoding unit in the eighth embodiment of the present technology.

FIG. 33 is a block diagram illustrating a configuration example of an encoding unit 330 in the eighth embodiment. The encoding unit 330 of the eighth embodiment differs from that of the first embodiment in that a write side data replacing unit 334 is disposed instead of the write side inverting unit 331.

The write side data replacing unit 334 replaces the value "2" corresponding to the LRS in the original data with the value "0" corresponding to the HRS and replaces "0" with "2." No replacement is performed on "1" corresponding to the MRS. Since decimal numbers of "2" and "0" are indicated by binary numbers of "10" and "00," in the replacement process of replacing one thereof with the other, a partial inversion process of inverting only one of the two bits is performed.

The write side data replacing unit 334 receives a comparison result from the comparing unit 320 as a replacement bit. In a case in which the replacement bit is "1," the write side data replacing unit 334 performs the replacement process on the original data. Then, the write side data replacing unit 334 supplies data which has undergone the replacement process to the non-volatile memory 400 as replacement data together with the replacement bit.

On the other hand, in a case in which the replacement bit is "0," the write side data replacing unit 334 supplies the original data to the non-volatile memory 400 together with the replacement bit.

Figure 34:
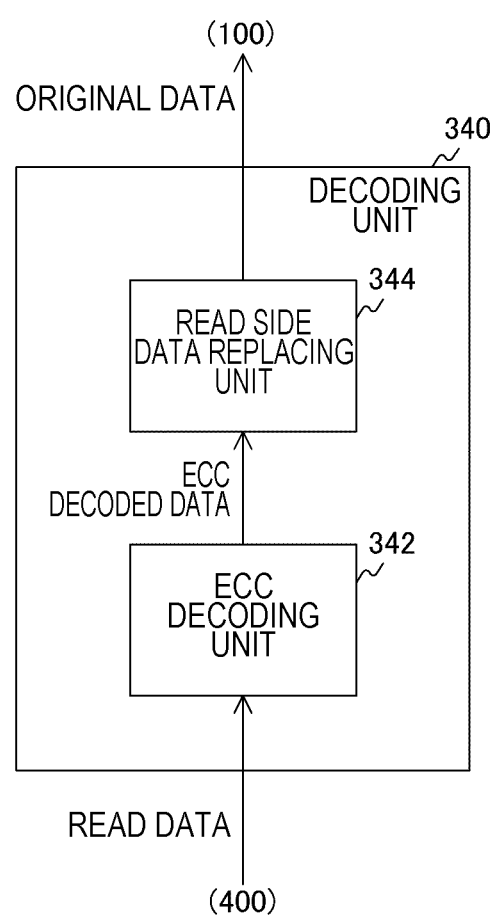
FIG. 34 is a block diagram illustrating a configuration example of a decoding unit in the eighth embodiment of the present technology.

FIG. 34 is a block diagram illustrating a configuration example of a decoding unit 340 in the eighth embodiment. The decoding unit 340 of the eighth embodiment differs from that of the first embodiment in that a read side data replacing unit 344 is disposed instead of the read side inverting unit 341. A configuration of the read side data replacing unit 344 is similar to that of the write side data replacing unit 334.

FIGS. 35A, 35B, 35C, and 35D are diagrams illustrating an example of data before and after encoding in the eighth embodiment. FIG. 35A is a diagram illustrating an example of the original data, and FIG. 35B is a diagram illustrating an example of the replacement data. Further, FIG. 35C is a diagram illustrating an example of the ECC encoded target data, and FIG. 35D is a diagram illustrating is an example of the write data.

First, the memory controller 300 estimates the IR drop when the original data is held in the memory cell without performing the replacement process. The original data is a binary number of "0000000001011010." The original data which is delimited in units of 2 bits and indicated by a decimal number is "00001122." If the leakage current of the memory cell of "1" (MRS) in the original data is indicated by $I_{LEAK}$, and the leakage current of the memory cell of "2" (LRS) is indicated by 2 $I_{LEAK}$, the IR drop is estimated to be 41 $I_{LEAK}R_0$.

In a case in which the estimation value of the IR drop exceeds the threshold value, the memory controller 300 performs the replacement process and generates the interchanging data "22221100" as illustrated in FIG. 35B. The IR drop of the inversion data is estimated to be 31 ILEAKR0. As described above, the IR drop is reduced through the replacement process.

As described above, according to the eighth embodiment of the present technology, since the value corresponding to the HRS is replaced with the value corresponding to the LRS on the basis of the estimation value of the voltage drop amount, the increase in the voltage drop amount in the memory system including the multi-valued memory cell installed therein can be suppressed.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disc), a memory card, and a Blu-ray disc (registered trademark) can be used.

Note that the effects described here are not necessarily limited, and any effect described in the present disclosure may be exhibited.

Additionally, the present technology may also be configured as below.

(1)

A memory controller, including:

a voltage drop amount estimating unit configured to estimate a voltage drop amount from a wiring resistance of a wiring up to a memory cell and a leakage current occurring in the memory cell when original data is caused to be held in the memory cell; and an encoding unit configured to perform a predetermined encoding process on the original data in a case in which the estimated voltage drop amount exceeds a predetermined threshold value.

(2)

The memory controller according to (1), in which the original data includes a plurality of pieces of section data, and the voltage drop amount estimating unit estimates the voltage drop amount on a basis of a weight coefficient corresponding to a representative value of the wiring resistance in each of the plurality of pieces of section data and a value corresponding to a leakage current in each of the plurality of pieces of section data.

(3)

The memory controller according to (1) or (2), further including:

a memory cell array including memory cells arranged in a two-dimensional lattice pattern;

a row driver configured to drive a row including the memory cells arranged in a predetermined direction; and a column driver configured to drive a column including the memory cells arranged in a direction perpendicular to the predetermined direction, in which the voltage drop amount estimating unit estimates the voltage drop amount from the leakage current and the wiring resistance of the wiring from the row driver or the column driver to the memory cell.

(4)

The memory controller according to (3), further including an address generating unit configured to generate any of an address indicating a position of a block including the memory cells arranged in a predetermined direction in the memory cell array and an address indicating a position of a block including the memory cells arranged in a direction perpendicular to the predetermined direction, as a write address.

(5)

The memory controller according to (4), in which the address generating unit generates an address indicating a position of a plurality of blocks in which a sum of block sizes is constant, as the write address.

(6)

The memory controller according to (4) or (5), in which the memory cell array is divided into an estimation-free region in which a wiring distance from the row driver and a wiring distance from the column driver do not exceed a predetermined distance and an estimation region in which the wiring distances exceed the predetermined distance, and the voltage drop amount estimating unit estimates the voltage drop amount when the original data is caused to be held in the estimation region.

(7)

The memory controller according to (6), in which the row driver includes an odd-numbered row driver configured to drive odd-numbered rows, and an even-numbered row driver configured to drive even-numbered rows, and the voltage drop amount estimating unit estimates the voltage drop amount on a basis of a wiring resistance of the wiring from the odd-numbered row driver in a case in which the original data is caused to be held in the odd-numbered row in a predetermined estimation region, and estimates the voltage drop amount on a basis of a wiring resistance of the wiring from the even-numbered row driver in a case in which the original data is caused to be held in the even-numbered row in the predetermined estimation region.

(8)

The memory controller according to (6) or (7), in which the column driver includes an odd-numbered column driver configured to drive odd-numbered columns, and an even-numbered column driver configured to drive even-numbered columns, and the voltage drop amount estimating unit estimates the voltage drop amount on a basis of a wiring resistance of the wiring from the odd-numbered column driver in a case in which the original data is caused to be held in the odd-numbered column in a predetermined estimation region, and estimates the voltage drop amount on a basis of a wiring resistance of the wiring from the even-numbered column driver in a case in which the original data is caused to be held in the even-numbered column in the predetermined estimation region.

(9)

The memory controller according to any of (1) to (8), in which the encoding unit outputs non-management information and management information for decoding the non-management information in the predetermined encoding process.

(10)

The memory system according to (9), in which the predetermined encoding process is an inversion process of inverting the original data, and the management information includes an inversion bit indicating whether or not the inversion process is performed.

(11)

The memory controller according to (9), in which the predetermined encoding process is an interchanging process of interchanging an order of bits of the original data, and the management information includes an interchanging bit indicating whether or not the interchanging process is performed.

(12)

The memory controller according to (9), in which the memory cell is a multi-value memory cell configured to hold a plurality of bits, the encoding process includes a replacement process of replacing a specific value to be held in the multi-value memory cell in the original data with a value different from the specific value, and the management information includes a replacement bit indicating whether or not the replacement process is performed.

(13)

The memory controller according to (9), in which the encoding unit performs an error detection and correction encoding process of generating parity used for detecting presence or absence of an error in the non-management information, and the predetermined encoding process.

(14)

The memory controller according to any of (1) to (12), in which the encoding unit performs an error detection and correction encoding process of generating parity used for detecting presence or absence of an error of the original data and supplying the parity to the voltage drop amount estimating unit together with the original data, and the predetermined encoding process, and the voltage drop amount estimating unit estimates a voltage drop amount from the wiring resistance and a leakage current occurring in the memory cell when the original data and the parity are caused to be held in the memory cell.

(15)

A memory controller, including:

an address generating unit configured to generate any of an address indicating a position of a block including memory cells arranged in a predetermined direction in a memory cell array including a plurality of memory cells arranged in a two-dimensional lattice pattern and an address indicating a position of a block including memory cells arranged in a direction perpendicular to the predetermined direction, as a write address; and an encoding unit configured to encode original data and supply the encoded original data as write data to be held at the write address.

(16)

A non-volatile memory, including:

a voltage drop amount estimating unit configured to estimate a voltage drop amount from a wiring resistance of a wiring up to a memory cell and a leakage current occurring in the memory cell when original data is caused to be held in the memory cell;

an encoding unit configured to perform a predetermined encoding process on the original data and generate write data in a case in which the estimated voltage drop amount exceeds a predetermined threshold value; and a driver configured to drive the memory cell array on a basis of the write data.

(17)

A method of controlling a memory controller, including:

a voltage drop amount estimation process of estimating a voltage drop amount from a wiring resistance of a wiring up to a memory cell and a leakage current occurring in the memory cell when original data is caused to be held in the memory cell; and an encoding process of performing a predetermined encoding process on the original data in a case in which the estimated voltage drop amount exceeds a predetermined threshold value.

REFERENCE SIGNS LIST

100 host computer
200 storage
300 memory controller
301 host interface
302 RAM 303 CPU
304 ECC processing unit
305 ROM
306, 440 bus
307 memory interface
310, 461 voltage drop amount estimating unit
311 multiplying unit
312 multiplier
313 weight coefficient supplying unit
314 adding unit
315 counting unit
320, 462 comparing unit
330 encoding unit
331, 463 write side inverting unit
332 ECC encoding unit
333 write side interchanging unit
334 write side data replacing unit
340 decoding unit
341, 465 read side inverting unit
342 ECC decoding unit
343 read side interchanging unit
344 read side data replacing unit
350 command decoder
360 address converting unit
370 address translation table
400 non-volatile memory
410, 610 data buffer
420 MAU array unit
430, 630 address decoder
450 control interface
460 memory control unit
464 write processing unit
466 read processing unit
467 request decoder
500, 620 memory array unit
510 column driver
520 row driver
530 memory cell array
540 memory cell
541 bidirectional diode
542 variable resistive element
550 left row driver
560 upper column driver
570 lower column driver
580 right row driver
600 memory unit

The invention claimed is:

1. A memory controller, comprising:
a Central Processing Unit (CPU) configured to:
estimate a voltage drop amount based on a wiring resistance of a wiring up to a memory cell and a first leakage current that occurs in the memory cell when original data is caused to be held in the memory cell; and
perform an encoding process on the original data based on the estimated voltage drop amount that exceeds a threshold value.

2. The memory controller according to claim 1, wherein the original data includes a plurality of pieces of section data, and
the CPU is further configured to estimate the voltage drop amount based on a weight coefficient corresponding to a representative value of a wiring resistance in each of the plurality of pieces of section data and a value corresponding to a second leakage current in each of the plurality of pieces of section data.

3. The memory controller according to claim 1, further comprising:
a memory cell array including a plurality of memory cells arranged in a two-dimensional lattice pattern;
a row driver configured to drive a row including a plurality of first memory cells of the plurality of memory cells arranged in a determined direction; and
a column driver configured to drive a column including a plurality of second memory cells of the plurality of memory cells arranged in a direction perpendicular to the determined direction, wherein
the CPU is further configured to estimate the voltage drop amount based on the first leakage current and the wiring resistance of the wiring from the row driver or the column driver to the memory cell.

4. The memory controller according to claim 3, the CPU is further configured to generate at least one of a first address indicating a position of a first block including the plurality of first memory cells arranged in the determined direction in the memory cell array and a second address indicating a position of a second block including the plurality of second memory cells arranged in the direction perpendicular to the determined direction, as a write address.

5. The memory controller according to claim 4, wherein the CPU is further configured to generate a third address indicating a position of a plurality of blocks in which a sum of block sizes is constant, as the write address.

6. The memory controller according to claim 4, wherein the memory cell array is divided into
an estimation-free region in which a wiring distance from the row driver and a wiring distance from the column driver is equal to or less than a determined distance and
an estimation region in which the wiring distance from the row driver and the wiring distance from the column driver exceed the determined distance, and
the CPU is further configured to estimate the voltage drop amount when the original data is caused to be held in the estimation region.

7. The memory controller according to claim 6, wherein the row driver includes:
an odd-numbered row driver configured to drive odd-numbered rows; and
an even-numbered row driver configured to drive even-numbered rows, and
the CPU is further configured to:
estimate the voltage drop amount based on a wiring resistance of the wiring from the odd-numbered row driver when the original data is caused to be held in an odd-numbered row in a determined estimation region; and
estimate the voltage drop amount based on a wiring resistance of the wiring from the even-numbered row driver when the original data is caused to be held in an even-numbered row in the determined estimation region.

8. The memory controller according to claim 6, wherein the column driver includes:
an odd-numbered column driver configured to drive odd-numbered columns; and
an even-numbered column driver configured to drive even-numbered columns, and
the CPU is further configured to:
estimate the voltage drop amount based on a wiring resistance of the wiring from the odd-numbered column driver when the original data is caused to be held in an odd-numbered column in a determined estimation region; and estimate the voltage drop amount based on a wiring resistance of the wiring from the even-numbered column driver when the original data is caused to be held in an even-numbered column in the determined estimation region.

9. The memory controller according to claim 1, wherein the CPU is further configured to output non-management information and management information to decode the non-management information in the encoding process.

10. The memory controller according to claim 9, wherein the encoding process is an inversion process to invert the original data, and
the management information includes an inversion bit indicating whether the inversion process is performed.

11. The memory controller according to claim 9, wherein the encoding process is an interchanging process to interchange an order of bits of the original data, and
the management information includes an interchanging bit indicating whether the interchanging process is performed.

12. The memory controller according to claim 9, wherein the memory cell is a multi-value memory cell configured to hold a plurality of bits,
the encoding process includes a replacement process to replace a specific value to be held in the multi-value memory cell in the original data with a value different from the specific value, and
the management information includes a replacement bit indicating whether the replacement process is performed.

13. The memory controller according to claim 9, wherein the CPU is further configured to perform an error detection and correction encoding process to generate parity, and
the parity is used to detect presence or absence of an error in the non-management information and the encoding process.

14. The memory controller according to claim 1, wherein the CPU is further configured to:
perform an error detection and correction encoding process to generate parity, wherein the parity is used to detect presence or absence of an error of the original data;
supply the parity together with the original data; and
estimate the voltage drop amount based on the wiring resistance and a third leakage current that occurs in the memory cell when the original data and the parity are caused to be held in the memory cell.

15. A memory controller, comprising:
a Central Processing Unit (CPU) configured to:
generate at least one of a first address and a second address, as a write address, wherein
the first address indicates a position of a first block including a plurality of first memory cells arranged in a determined direction in a memory cell array,
the second address indicates a position of a second block including a plurality of second memory cells arranged in a direction perpendicular to the determined direction,
the memory cell array includes a plurality of memory cells arranged in a two-dimensional lattice pattern, and
the plurality of memory cells includes the plurality of first memory cells and the plurality of second memory cells;
estimate a voltage drop amount based on a wiring resistance of a wiring up to a memory cell of the plurality of memory cells and a leakage current that occurs in the memory cell when original data is caused to be held in the memory cell;
encode the original data based on the estimated voltage drop amount that exceeds a threshold value; and
supply the encoded original data as write data to be held at the write address.

16. A non-volatile memory, comprising:
a Central Processing Unit (CPU) configured to:
estimate a voltage drop amount based on a wiring resistance of a wiring up to a memory cell and a leakage current that occurs in the memory cell when original data is caused to be held in the memory cell;
perform an encoding process on the original data; and
generate write data based on the estimated voltage drop amount that exceeds a threshold value; and
a driver configured to drive the memory cell based on the write data.

17. A method of controlling a memory controller, the method comprising:
estimating a voltage drop amount based on a wiring resistance of a wiring up to a memory cell and a leakage current that occurs in the memory cell when original data is caused to be held in the memory cell; and
performing an encoding process on the original data based on the estimated voltage drop amount that exceeds a threshold value.

* * * * *